(12) United States Patent
Darwish et al.

(10) Patent No.: US 8,310,007 B2
(45) Date of Patent: Nov. 13, 2012

(54) INTEGRATED POWER SUPPLIES AND COMBINED HIGH-SIDE PLUS LOW-SIDE SWITCHES

(75) Inventors: Mohamed N. Darwish, Campbell, CA (US); Jun Zeng, Torrance, CA (US)

(73) Assignee: MaxPower Semiconductor Inc., Santa Clara, CA (US)

( * ) Notice: Subject to any disclaimer, the term of this patent is extended or adjusted under 35 U.S.C. 154(b) by 282 days.

(21) Appl. No.: 12/834,573

(22) Filed: Jul. 12, 2010

(65) Prior Publication Data
US 2011/0006361 A1    Jan. 13, 2011

Related U.S. Application Data

(60) Provisional application No. 61/225,021, filed on Jul. 13, 2009.

(51) Int. Cl.
*H01L 29/66* (2006.01)
(52) U.S. Cl. ........ 257/341; 257/342; 257/329; 257/335; 257/339; 257/328

(58) Field of Classification Search .................. 257/220, 257/242, 263, 302, 374, E21.548, E27.054, 257/E27.057, E27.096, E29.118, E29.189, 257/E29.198, E29.257, 328–346, E29.26, 257/21.546
See application file for complete search history.

(56) References Cited

U.S. PATENT DOCUMENTS
7,566,931 B2 *   7/2009   Kocon ........................ 257/328
* cited by examiner

*Primary Examiner* — Steven Loke
*Assistant Examiner* — Cuong Nguyen
(74) *Attorney, Agent, or Firm* — Robert O. Groover, III

(57) ABSTRACT

The present application discloses new approaches to integrated power. Two new classes of structures each provide an integrated phase leg, in a process which can easily be integrated with low-voltage and/or peripheral circuits: in one class of disclosed structures, a lateral PMOS device is combined with an NMOS device which has predominantly vertical current flow. In another class of embodiments, a predominantly vertical n-channel device is used for the low-side switch, in combination with a lateral n-channel device. In either case, the common output node is preferably brought out at a backside contact. This device structure is advantageously used to construct complete power supply and/or voltage conversions circuits on a single chip (perhaps connected to external passive reactances).

17 Claims, 32 Drawing Sheets

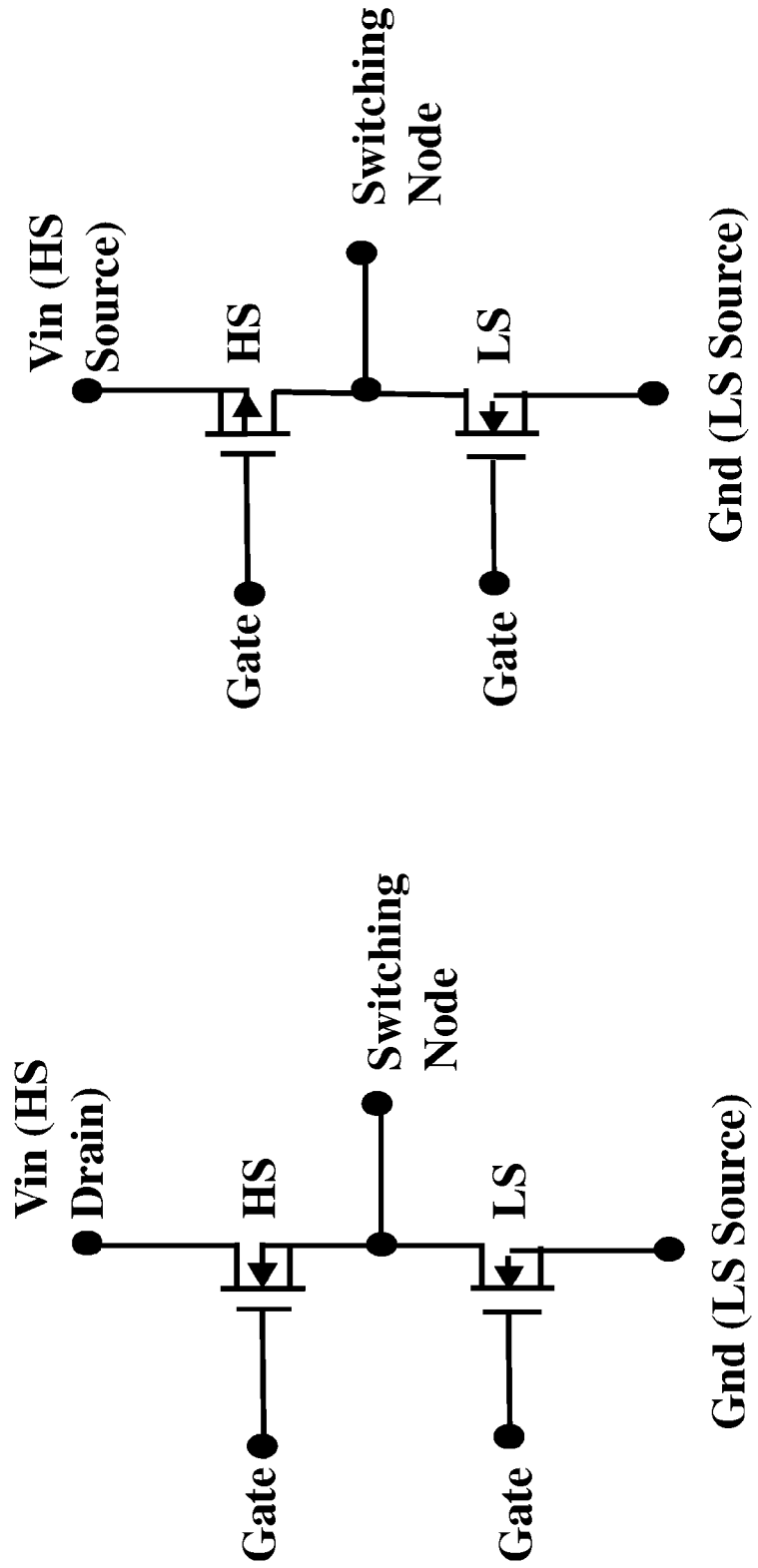

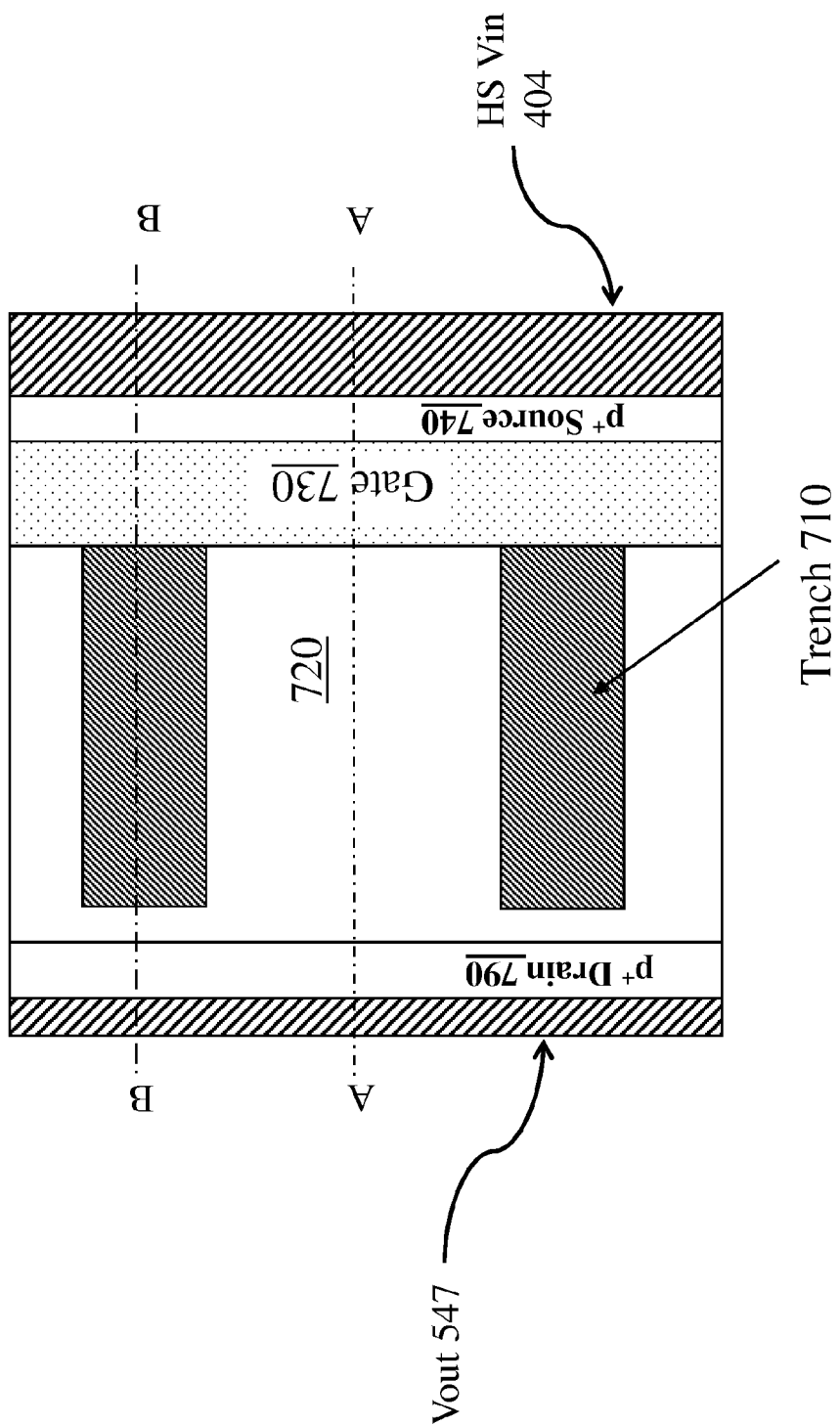
Figure 7(a): Top view of HS P-Channel lateral MOSFET structure

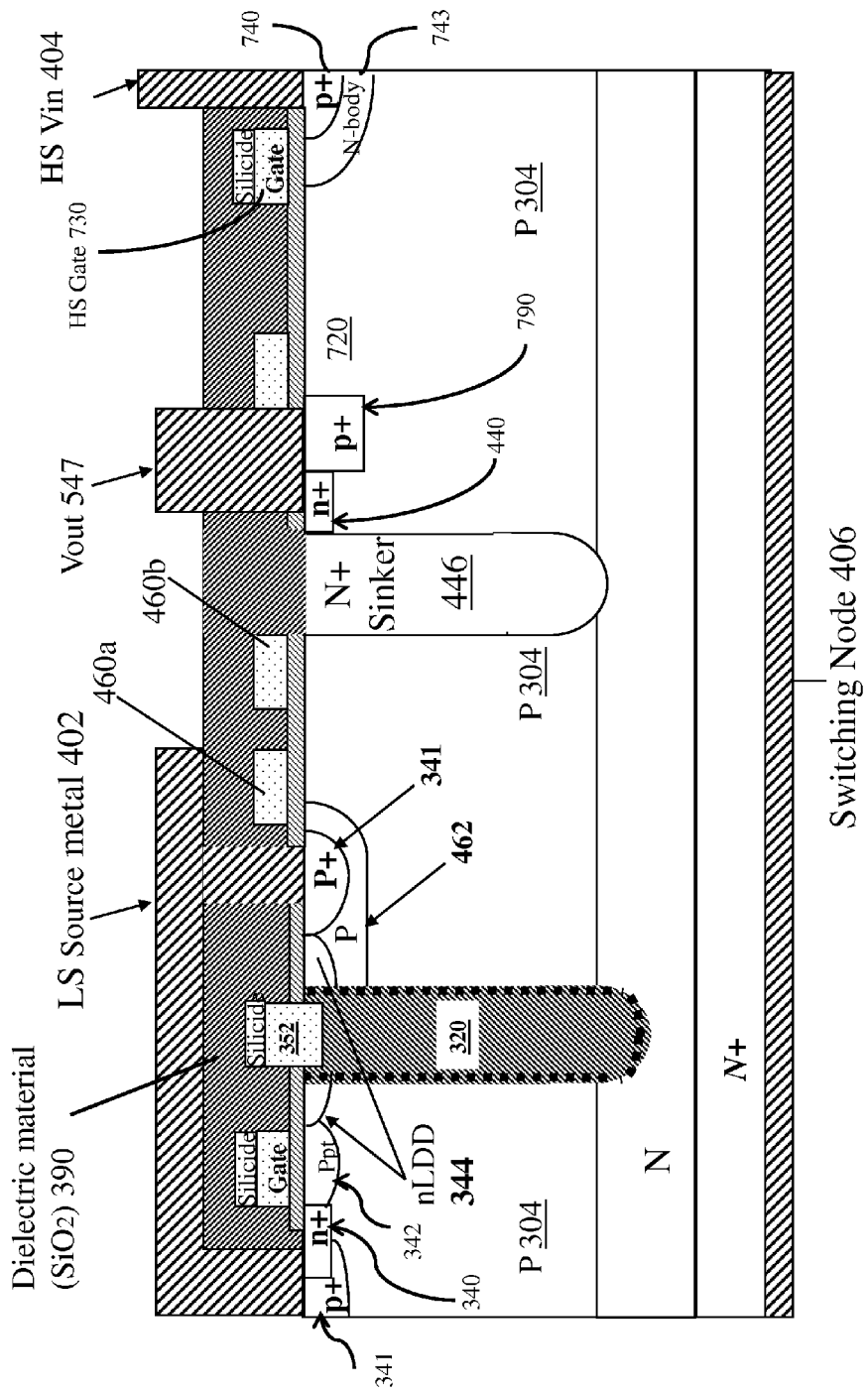
Figure 7(b): Cross section of the HS P-channel MOSFET is along AA

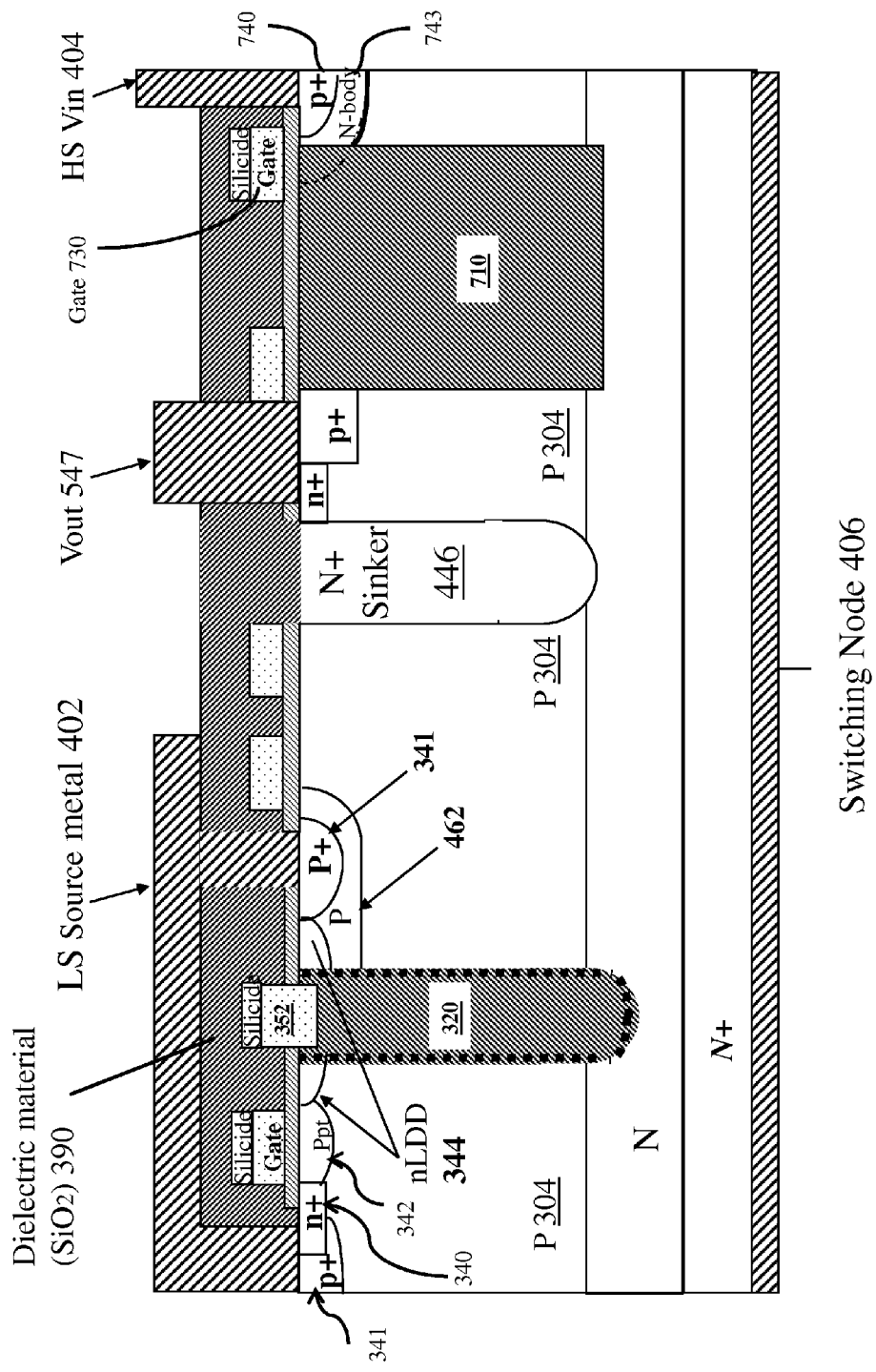
Figure 7(c) Cross section of the HS P-channel MOSFET is along BB

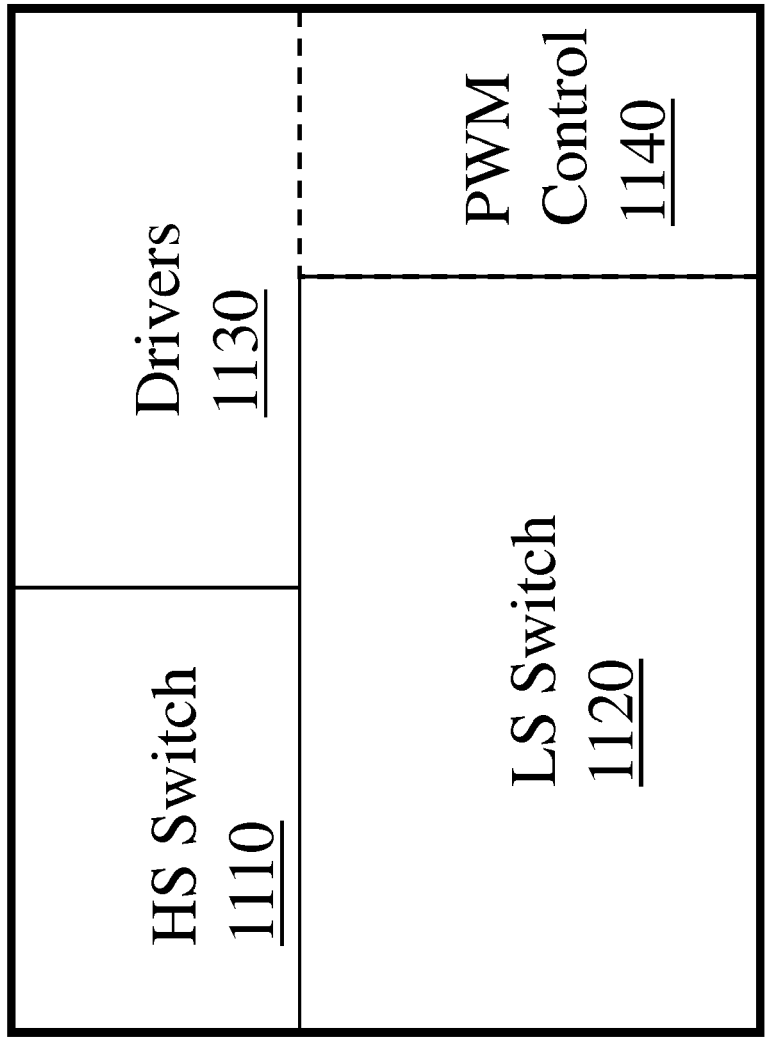
Figure 11: Simplified schematic of a monolithically integrated DC-DC converter.

INTEGRATED POWER SUPPLIES AND COMBINED HIGH-SIDE PLUS LOW-SIDE SWITCHES

CROSS-REFERENCE

Priority is claimed from U.S. application Ser. No. 61/225,021 filed 13 Jul. 2009, which is hereby incorporated by reference.

BACKGROUND

The present application relates to integrated power, and more particularly to integration of complete switching circuits.

Note that the points discussed below may reflect the hindsight gained from the disclosed inventions, and are not necessarily admitted to be prior art.

The phenomenal increase in power demands of many electronic applications such as computing and telecommunications are driving rapid developments in semiconductor components for power conversion. Recent progress in power device technology has enabled the widespread use of distributed dc power management systems. These architectures offer the advantage of delivering several regulated localized supply rails with ease and the flexibility of selective subsystem shutdown. Power is supplied via a main power bus from an ac-to-dc converter or battery and feeds a number of dc-to-dc converters. Switch-mode dc-to-dc converters provide higher efficiencies, particularly where a low output-to-input voltage ratio results from the widening gap between modern battery technology output voltages and the operating voltages of future ULSI technology.

A generic simplified synchronous buck converter shown in FIG. 1 includes controller and driver functional blocks 110 and 120 respectively. These operate a power High-Side ("HS") switch Q1 and a Low-Side ("LS") (synchronous) switch Q2 to regulate the delivery of charge to the load. In this example a series inductance L and shunt capacitance C are used to provide a desired voltage Vout to a load R, but many other circuit configurations are possible.

FIGS. 2(a) and 2(b) show two different known circuit configurations which combine high-side and low-side switches. In FIG. 2(a) N-channel transistors are used for both the high-side and low-side switches, and in FIG. 2(b) a P-channel transistor is used for the high-side switch and an N-channel is used for the low-side switch.

For some applications it is desirable to integrate the high-side and low-side power switches into a single power component. In many other applications it is desirable to integrate the controller-driver functions plus the high-side and low-side power switches into a single power IC. In addition to the advantages of reduced size, a reduction in the number of external components brings about an expected performance improvement due to the elimination of parasitic inductances and capacitances. This enables switching at higher frequencies. Furthermore, integration of the digital cores, analog, and power devices into a single IC enables the design of a complete dc-to-dc converter system using only few external components and lower cost.

The present inventors have proposed, in copending applications, improvements for both vertical and lateral power MOSFET structures, in which the switching performance is improved by incorporating fixed or permanent electrostatic charges. For example, in the device shown in FIG. 3(a), permanent positive charge ($Q_F$) 322 is incorporated in trenches 320 filled with a dielectric material such as silicon dioxide. This provides immobile net electrostatic charge. This can be done, for example, by angle-implanting Cesium ions into a thin oxide layer before the trench is filled. The permanent charge shapes the electric field at reverse bias and results in a higher breakdown voltage. In the on-state the permanent charge forms an induced electron drift region in a power MOSFET by forming an inversion layer along the interface between the oxide and P layer. By making use of this new concept a small cell pitch and high packing density can be realized to reduce the device total on resistance.

The circuit combination of a high-side switch in series with a low-side switch, which permits an output node to be connected either to the high-side supply or the low-side supply, is sometimes referred to as a half-bridge or "phase leg." Integrated phase leg structures have been proposed in, for example, U.S. Pat. No. 6,331,794, which is hereby incorporated by reference.

SUMMARY

The present application discloses new approaches to integrated power. Two new classes of structures provide an integrated half-bridge or phase leg, in a process which can easily be integrated with low-voltage and/or peripheral circuits: in one class of disclosed structures, a lateral PMOS device is combined with an NMOS device which has predominantly vertical current flow along trenches which have net electrostatic charge. In another class of embodiments, a lateral NMOS device is combined with an NMOS device which has predominantly vertical current flow along trenches which have net electrostatic charge. In either case, the common output node is preferably (but not necessarily) brought out at a backside contact.

This device structure is advantageously used to construct integrated high-side and low-side power switches into a single power component, complete power supply and/or voltage conversion circuits on a single chip (perhaps connected to external passive reactances).

BRIEF DESCRIPTION OF THE DRAWINGS

The disclosed inventions will be described with reference to the accompanying drawings, which show important sample embodiments of the various disclosed inventions and which are incorporated in the specification hereof by reference, wherein:

FIGS. 2(a) and 2(b) show two different configurations of high-side and low-side switches.

FIGS. 7(a), 7(b), 7(c), 8(a), 8(b), 8(c), 8(d), 9(a), 9(b), 9(c), 9(d), 10(a), 10(b), 10(c), and 10(d) show a wide variety of device structures in which a lateral P-channel transistor is connected in series with a vertical N-channel transistor to drive a backside and/or frontside common node connection.

FIG. 11 shows an example of a monolithically integrated dc-dc converter using series structures according to any of FIGS. 4(a)-10(d) or the like, in combination with necessary adjunct circuits.

DETAILED DESCRIPTION OF SAMPLE EMBODIMENTS

Figure 1:
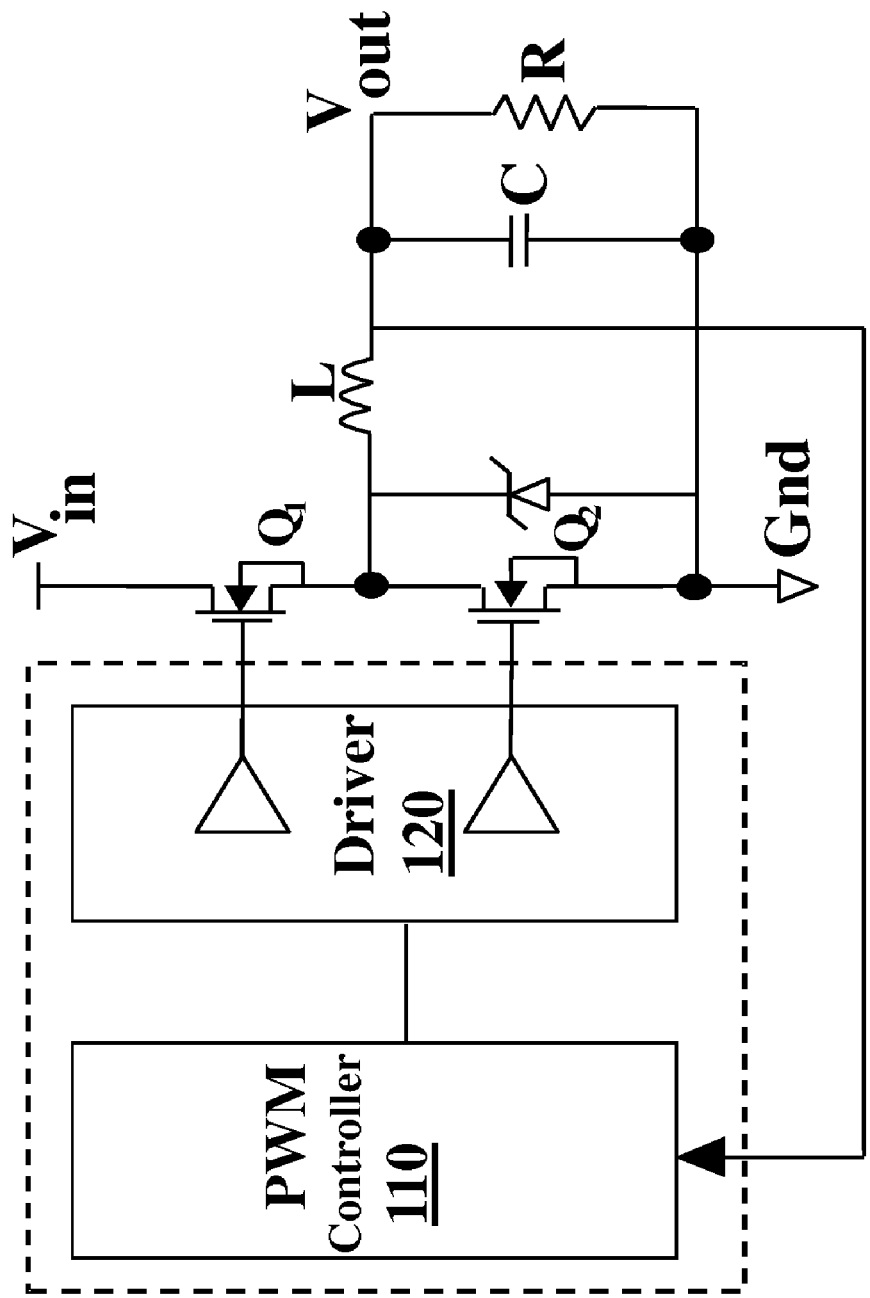
FIG. 1 shows a circuit diagram of a simplified synchronous buck converter.

The numerous innovative teachings of the present application will be described with particular reference to presently preferred embodiments (by way of example, and not of limitation). The present application describes several inventions, and none of the statements below should be taken as limiting the claims generally.

The present application discloses a number of different integrated device structures which combine high-side and low-side switches. These structures can also be combined with driver and control circuitry for monolithic integration of dc-dc converters.

Phase leg combinations like those of FIG. 2(a) (NMOS+NMOS transistors) and FIG. 2(b) (NMOS+PMOS transistors) have long been discussed in principle, but there are some difficulties in integrating two power semiconductor devices in a single chip. Modern power devices have increasingly tended toward vertical current flow (as exemplified by vertical or quasi-vertical transistors), but integration of two such devices to provide a phase leg is difficult without increasing the process complexity. In particular, normal epitaxial structures do not work well for this.

A typical vertical transistor will have a p-type body surrounding an n+ source. An insulated gate is positioned to invert a portion of the p-type body to form a channel; when such a channel is formed, electrons can flow from the source through the channel into an n-type drift region, and thence to a drain which carries a positive voltage. The problem comes when we consider how to combine two such transistors to achieve an NMOS+NMOS phase leg as shown in FIG. 2(a): the two NMOS devices have their sources at very different potentials, and hence their body regions must also be at very different potentials. If a conventional vertical transistor is used for the low-side switch, that means that the output node must be a backside contact (or a buried layer, which poses its own complications). However, if the high-side switch is an n-channel transistor (as in FIG. 2(a)), that means that its source must be connected to the output node, and a p-type body must be connected to that source. The location of this second p-type body region, and the associated n-type drift region, requires adding processing steps and cause process difficulties.

The present inventors have realized that the use of net electrostatic charge in proximity to the drift region of a vertical device solves this riddle. In this case NMOS devices can be built in a p-on-n+ (or alternatively p-well on n-n+) structure, rather than in the n-type epitaxial layers normally used. This change is more important than it might appear, because now the p-type drift layer in a vertical n-channel device provides a "p-well" or p-body for lateral n-channel devices, or a p-type drain/drift region for a lateral p-channel device. Thus we suddenly have a synergistic combination: the low-side driver can be built in the best possible combination of specific on-resistance $R_{SP}$ and breakdown voltage, in a structure which is compatible with lateral devices. Moreover, this structure avoids the need for complex multi-well or multi-epi-layer structures which might pose difficulties in integration with low-voltage devices.

Figure 3A:
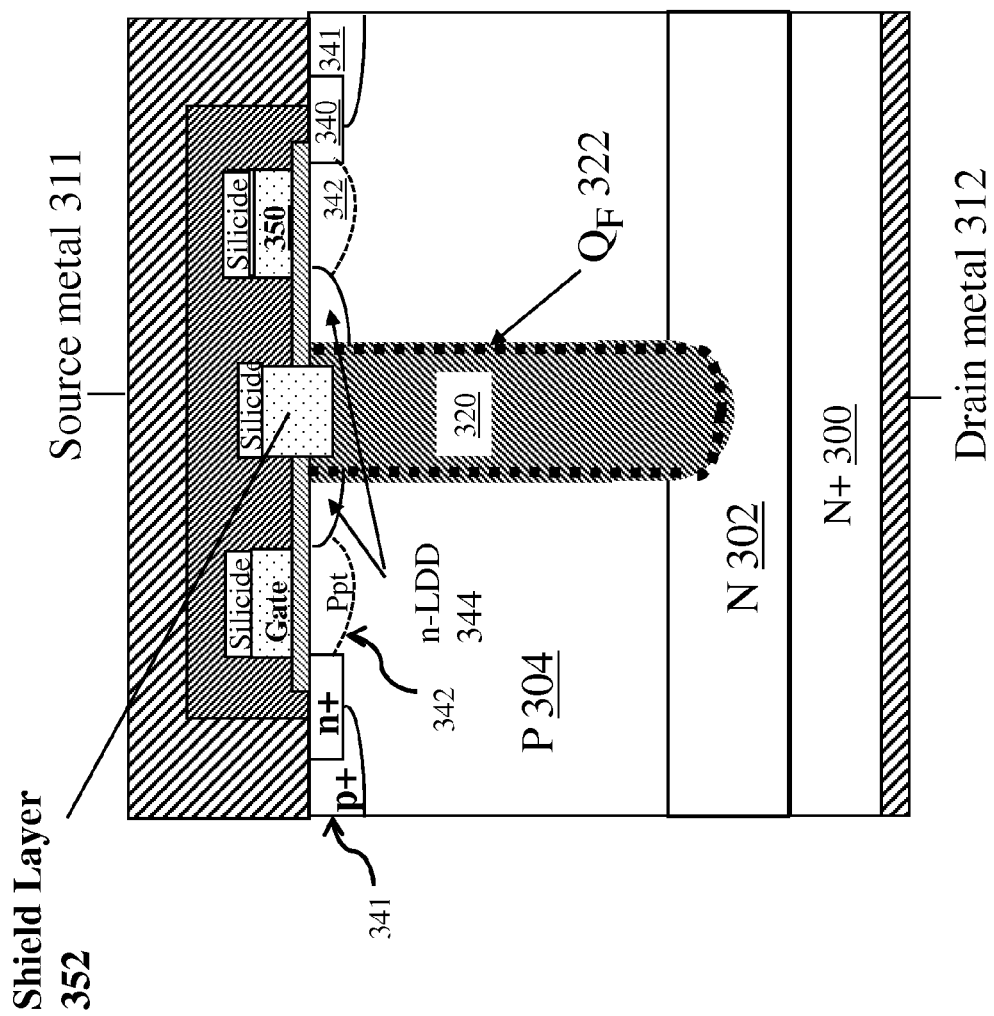
FIG. 3(a) shows an example of a class of devices, previously proposed by ones of the present inventors, in which permanent electrostatic charge is incorporated in an insulated trench in the drift region of a vertical device.

FIG. 3(a) shows a device previously proposed by the present inventors. In this device, permanent immobile net electrostatic charge 322 is incorporated into an insulated trench 320 which extends down into the epitaxial layer 304. Source metallization 311 makes ohmic contact to the n+ source diffusion 340 and to the p+ body contact diffusion 341. Note that in this example the p-type epitaxial layer 304 provides the p-type body, but is preferably enhanced by an additional p-type doping component, whose presence is indicated here by the Ppt doping component 342 shown inside a dotted line. Insulated gate electrode 350 inverts portions of the body to form a channel, when the gate is sufficiently positive. This permits electrons to pass through to the LDD region 344, and thence flow along the induced channel at the sidewall of trench 320 down to the shallow drain 302 and deep drain 300. Shield electrode 352 reduces the gate-drain capacitance. Drain metallization 312 makes a backside contact to the deep drain 300.

This example is referred to as a "quasi-vertical" device, since the overall carrier transport flows vertically (i.e. front side to back side), but the direction of carrier transport through the channel itself is predominantly horizontal. The disclosed innovations can also be implemented with trench-gate vertical transistors for the low-side switch: in this type of device carrier transport is vertical in the channel too.

The example shown in FIG. 3(a) is an n-channel quasi-vertical device, but the present inventors have proposed a vast number of alternative versions of such devices, many of which can be used in combined structures as described below. See e.g. WO/2008/039459, US20080073707, US20080191307, US20080164516, US20080164518, US20080164520, US20080166845, WO2009/102684; US20090206924, WO/2009/102651, US20090206913, US20090294892, U.S. patent application Ser. Nos. 12/431,852; 12/394,107; 12/432,917; 12/431,005; 12/369,385; 12/545,808; 12/626,523; 12/626,589. Applicants reserve the right to claim priority from these applications and/or from earlier applications to which these applications themselves claim priority, directly and/or indirectly, in all countries where such priority can be claimed.

Figure 3B:
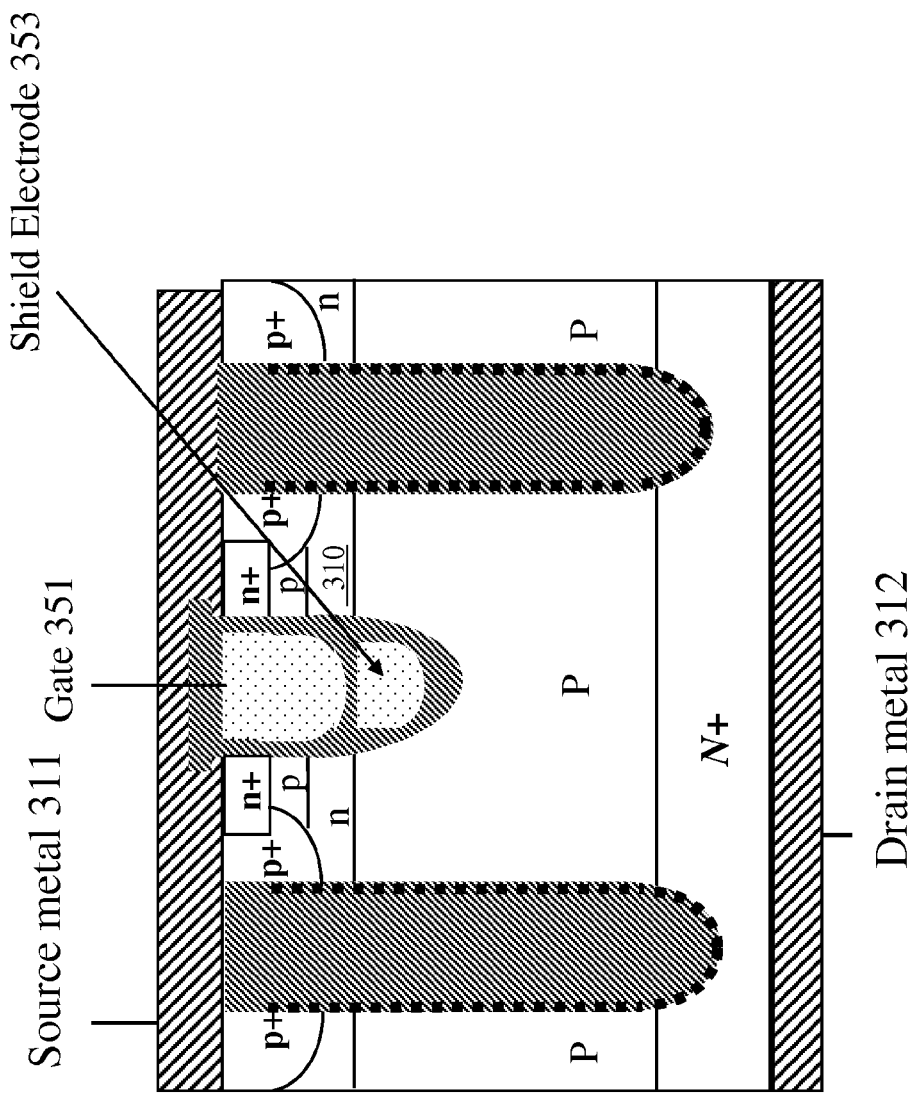
FIG. 3(b) shows another example of a class of devices that uses a shallower trench gate and a n-drain layer.

FIG. 3(b) shows an alternative device structure, which can be used for the low-side switch in the various device structures described above. Note that an intermediate n-type layer 310 routes electron flow from the channel to the induced drain extension regions, and thence to the deep drain. This particular example shows a split-gate structure, where a shield electrode lies below the gate electrode in the gate trench. However, many structures of this general type, which include a separate gate trench and an intermediate drain layer, can be combined with the numerous different device structures shown in the other drawings.

Figure 4A:
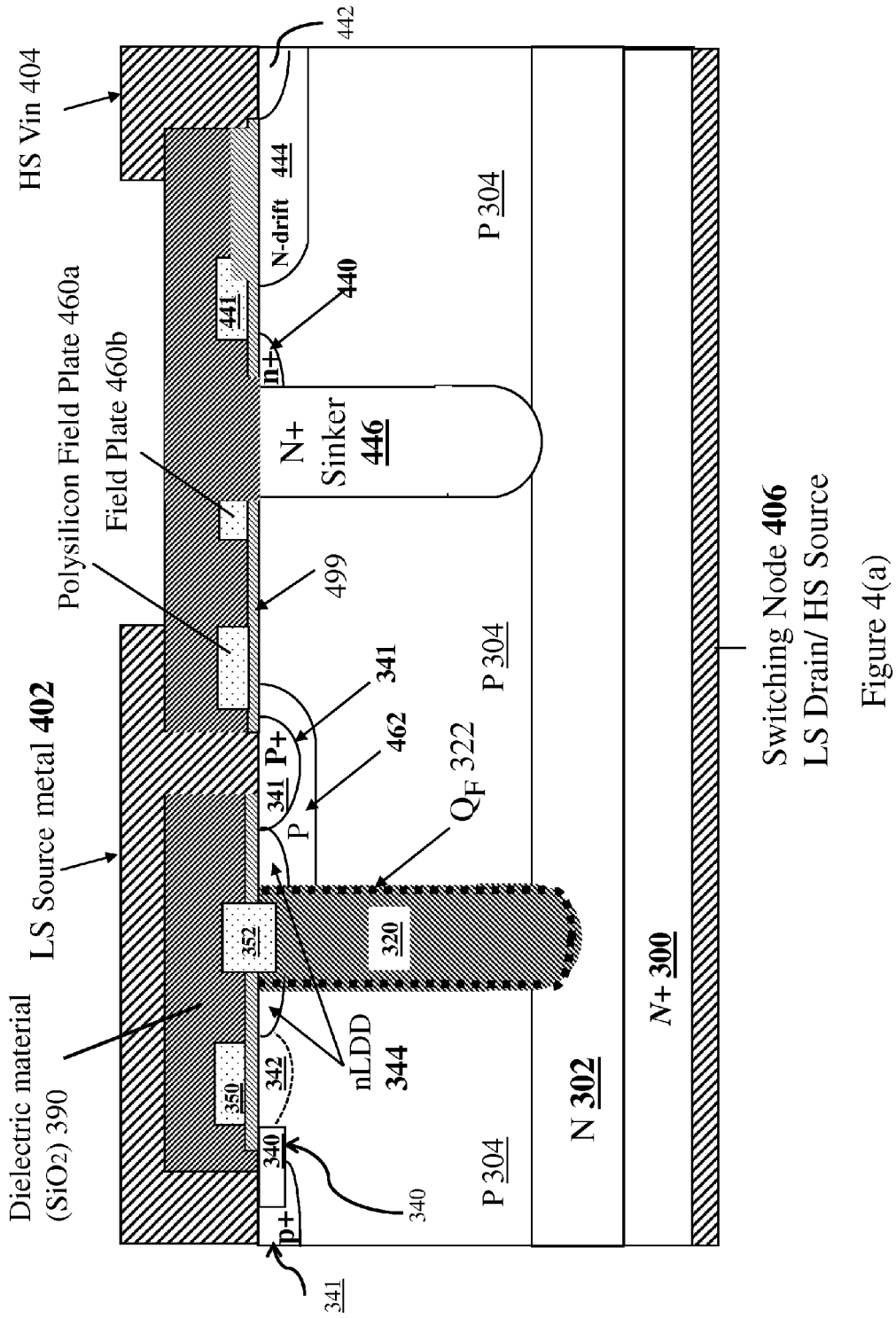
FIG. 4(a) shows one embodiment of an integrated vertical low-side N-channel (NMOS) transistor and a lateral high-side NMOS transistor.

FIG. 4(a) shows one embodiment of an integrated 5-terminal structure which combines a vertical low-side N-channel (NMOS) transistor and a lateral high-side NMOS transistor. Note that this example uses a p-type epitaxial layer 304 over an n-type buried layer 302 over an n+ substrate 300. (In this example all of these are silicon, but as discussed below there are many alternatives.) When the low-side transistor is ON (i.e. gate 350 driven to a sufficiently positive voltage), electron current from the n+ source 340 flows through the channel, the N-LDD 344, and the inversion layer formed by the positive permanent charge 322 in p-type epitaxial layer 304, to the n on n+ drain structure 302/300 (connected to Switching Node 406). When the high-side lateral transistor is ON, (i.e. gate 441 driven to a sufficiently positive voltage) electron current flows from the n+ source 440 through the channel (induced in p-type epi layer 304, and not separately shown), and through the n-type drift layer 444, to the n+ drain 442. It is important to note that the high-side n+ source 440 is connected to the N+ substrate 300 (and thus to Switching Node 406) by a heavily doped N+ sinker diffusion 446. The density of the permanent charge layer 322, the doping concentrations, and other parameters such as cell pitch and N+ sinker spacing are designed to achieve the target breakdown voltage (which will be different for different products and/or applications). It should also be noted that the n+ source 440 is shorted to the p-body of the lateral NMOS transistor at certain locations of the device (not shown).

Since the output node voltage can be close to the high supply voltage (if the pull-up device is on), the full voltage swing can appear across the lateral space between the front surface appearance of the output node (i.e. at the n+ source 440 of the high-side NMOS) and at the n+ source 340 and p+ body contact 341 of the low-side switch. This means that appropriate protection against breakdown must be built in. In the simple example shown in FIG. 4(a), the p+ body contact 341, at locations which are nearest to the sinker diffusion 446, is surrounded by a p-type diffusion 462. This diffusion, though shaped like a typical DMOS body diffusion, is not operating as a body here, but merely helps increase breakdown voltage. Field plates 460a and 460b also help to smooth the lateral gradation of potential. Field plate 460a can be connected to the LS source 402 and field plate 460b can be connected to the N+ sinker 446.

In this example the field plates 460a and 460b, the gate 350 of the quasi-vertical low-side transistor, and the gate 441 of the high-side transistor can optionally be formed from the same thin film layer, and all insulated from semiconductor active areas by a thin dielectric 499. Alternatively, the two gate electrodes can be formed from separate thin film layers. In various embodiments some or all of these elements can be cladded with a metal silicide, or made of a material other than polysilicon Thus the five terminals referred to above, in the embodiment of FIG. 4(a), are the two supply voltage connections 402 and 404, the two gate electrodes 350 and 441, and the switching or output node 406.

Figure 4B:
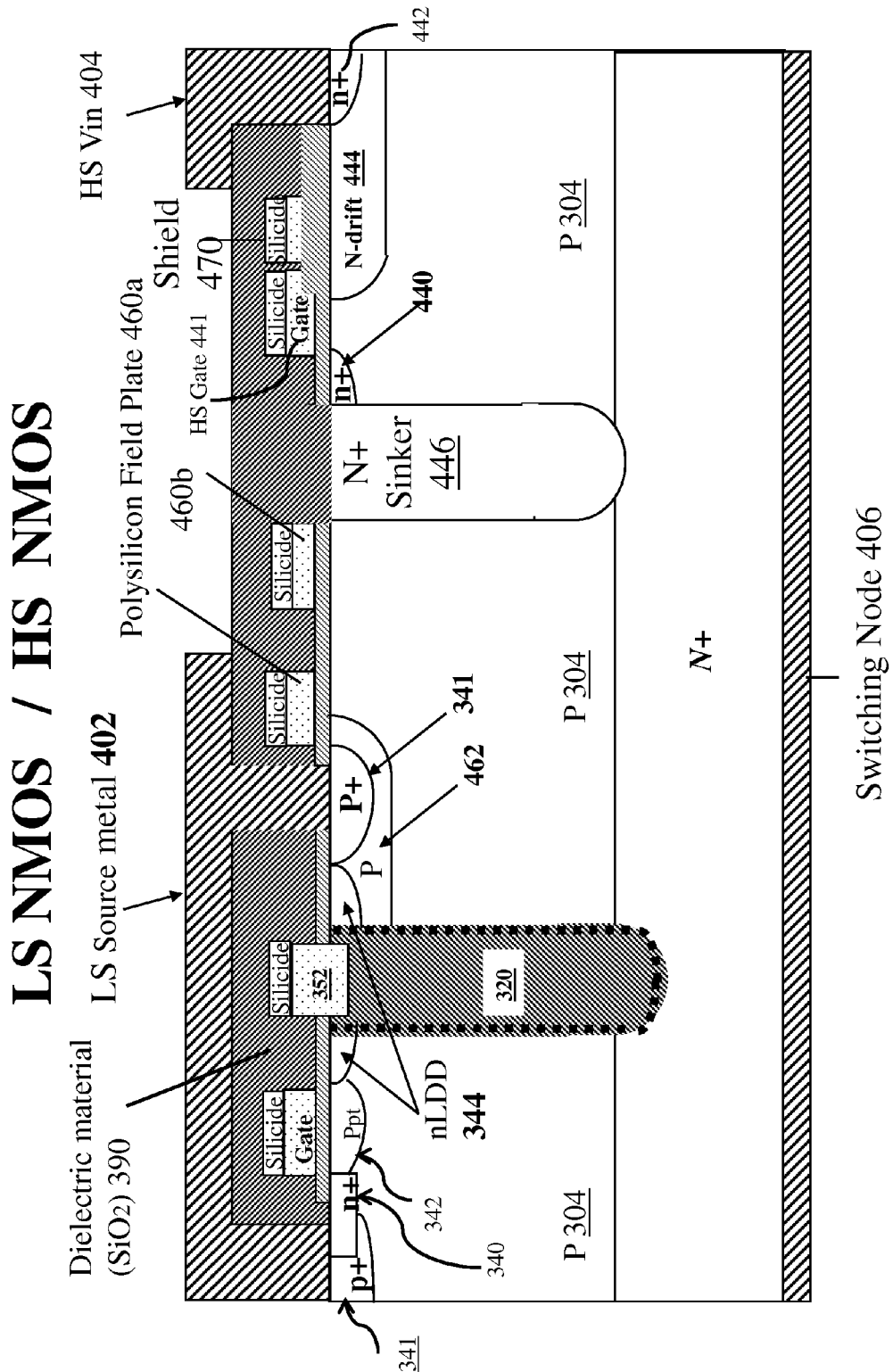
FIGS. 4(b), 4(c), 5(a), 5(b), 5(c), 5(d), 6(a), 6(b), 6(c), and 6(d) show various other classes of devices which, in various ways, are generally somewhat similar to and somewhat different from that shown in FIG. 4(a).

FIG. 4(b) shows another embodiment which is generally somewhat similar to that shown in FIG. 4(a), except that an additional embedded conductive shield layer 470 is present in the lateral high-side device. The shield layer 470 can be floating, or can be connected to the high-side source potential, and provides a reduction in gate-drain capacitance Cgd. Reference numerals in this Figure which have already been described in an earlier figure correspond to the respective descriptions already given.

Figure 4C:
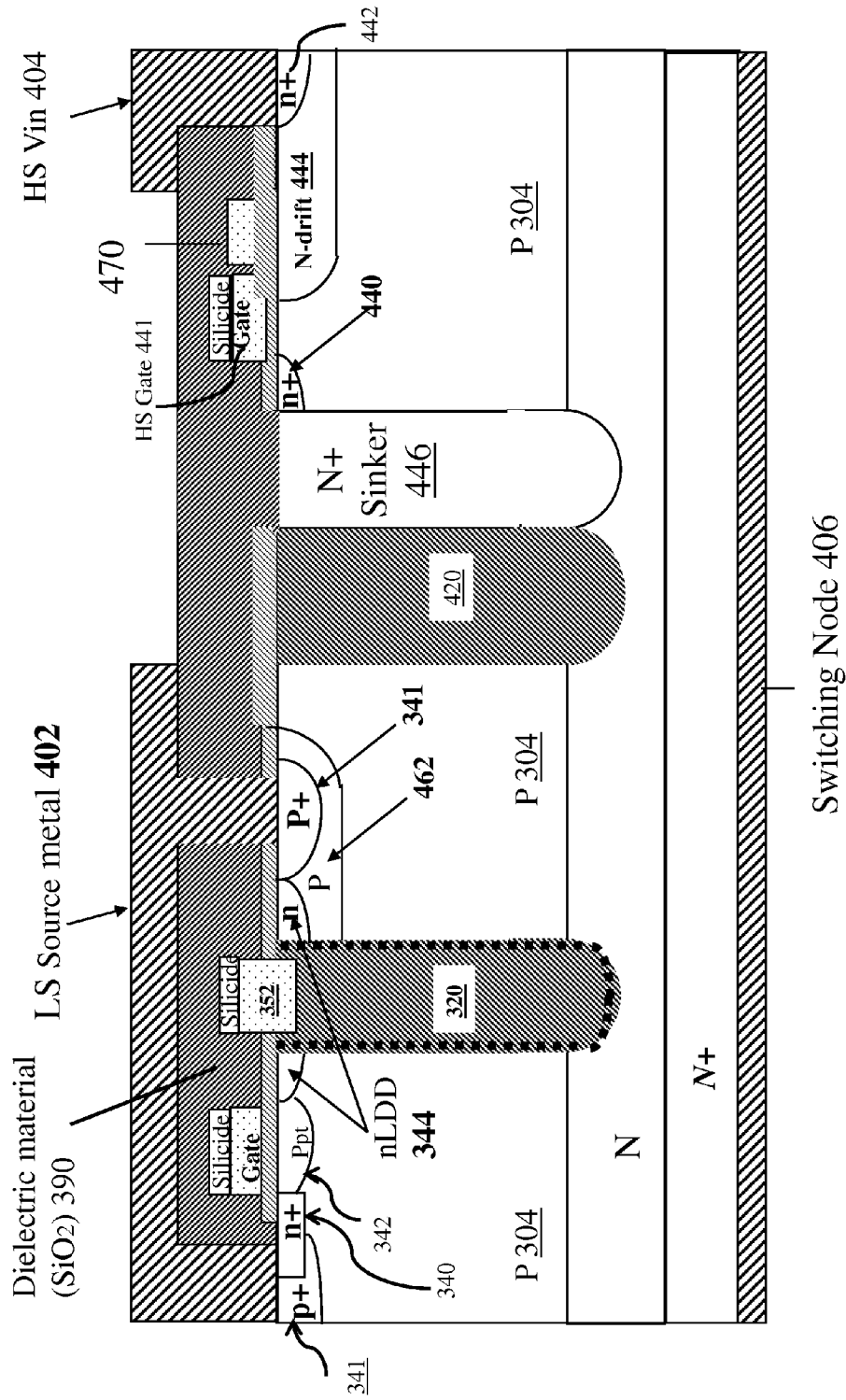

FIG. 4(c) shows another embodiment which is generally somewhat similar to that shown in FIG. 4(a), except that, in addition to the dielectric filled trench 320, another trench 420 which is adjacent to the N+ sinker is included. This improves the breakdown characteristics of the low-side NMOS. This also avoids the presence of a high lateral electric field in the semiconductor material, as discussed above with relation to FIG. 4(b). Reference numerals in this Figure which have already been described in an earlier figure correspond to the respective descriptions already given.

Figure 5A:
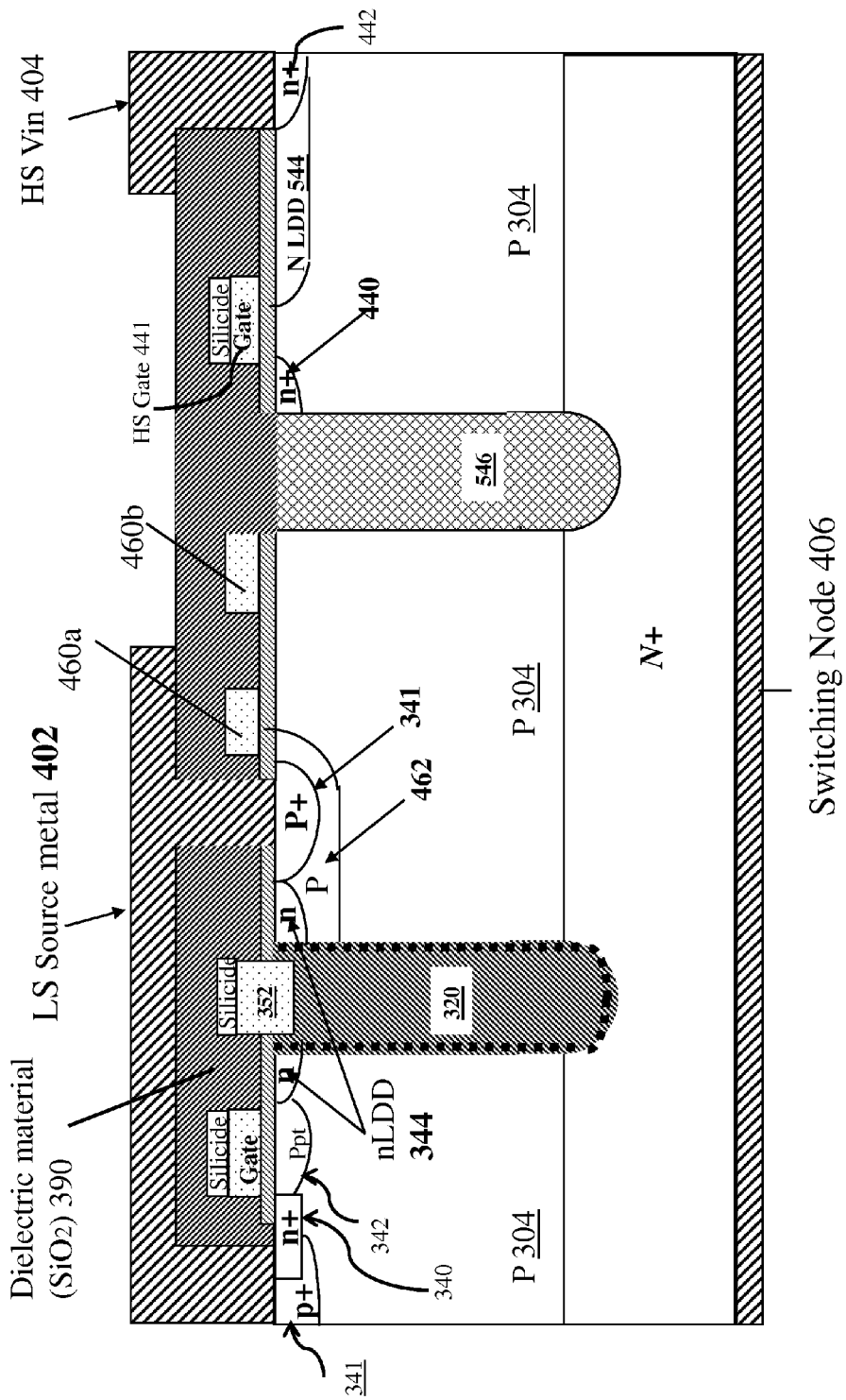

FIG. 5(a) shows another embodiment which is generally similar to that shown in FIG. 4(a), except that the N+ sinker 446 has been replaced by a trench 546 filled with a conductive material such as tungsten (i.e. a "tungsten plug"). This provides a low on-resistance path between the high-side n+ source and the N+ substrate (Switching Node). Another feature of this class of embodiments is that the N-drift region 444 is replaced by a shallower n-type LDD layer 544. This provides a simpler process, particularly for lower voltage devices such as 12V-20V switches. Reference numerals in this Figure which have already been described in an earlier figure correspond to the respective descriptions already given.

Figure 5B:
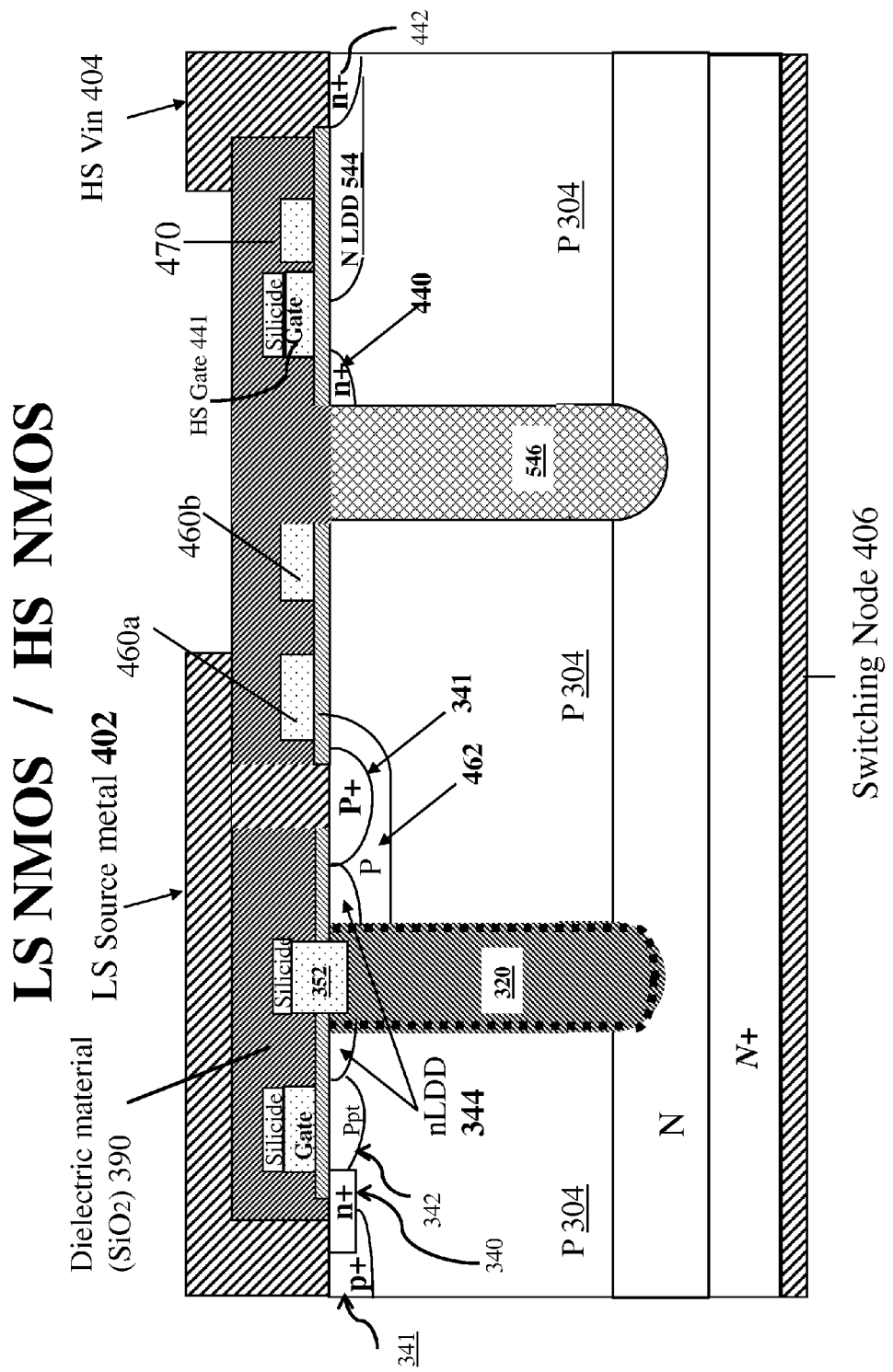

FIG. 5(b) shows another embodiment which is generally somewhat similar to that shown in FIG. 5(a), except that an additional embedded conductive shield layer 470 has been added into the lateral high-side device. Reference numerals in this Figure which have already been described in an earlier figure correspond to the respective descriptions already given.

Figure 5C:
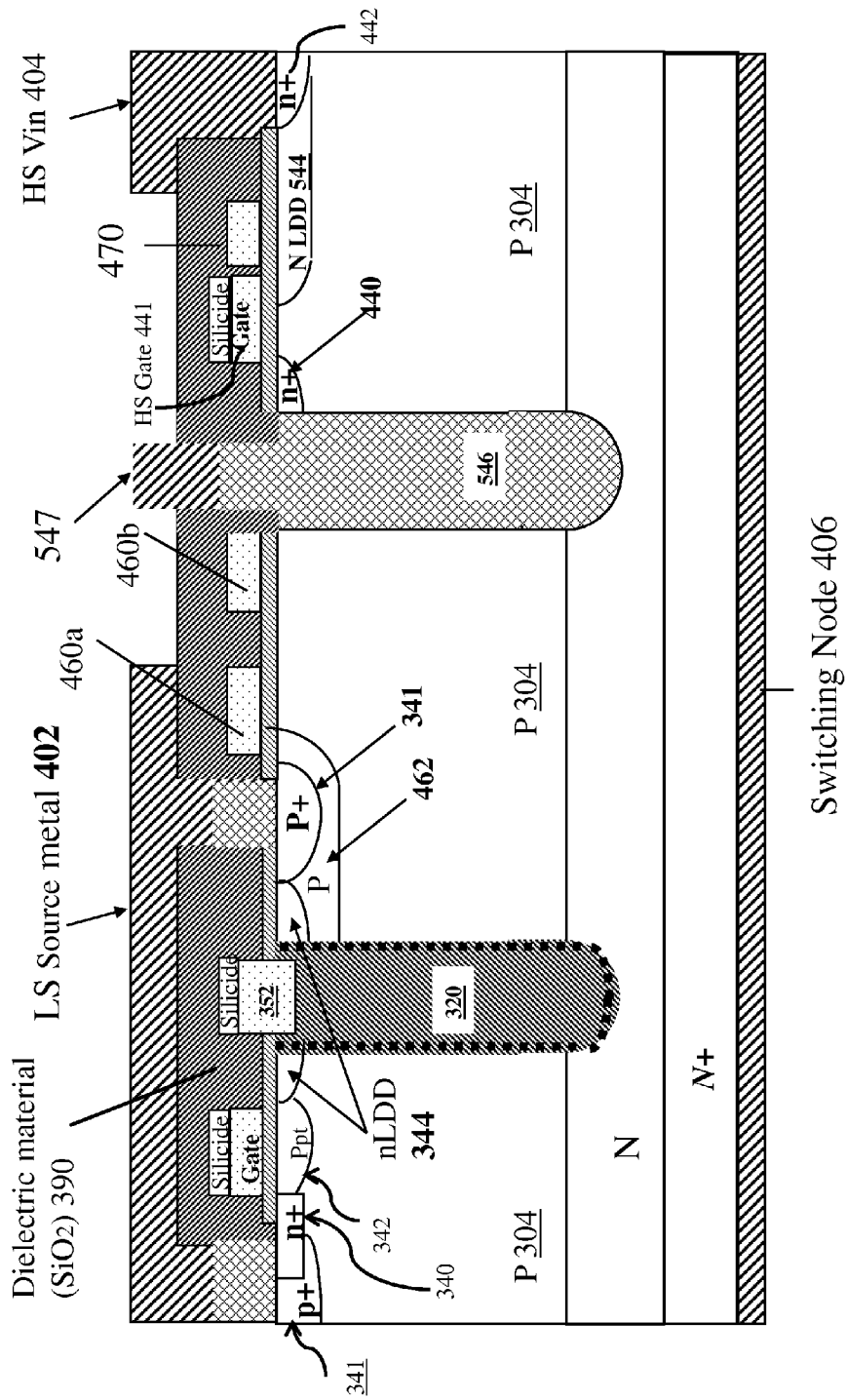

FIG. 5(c) shows another embodiment which is generally somewhat similar to that of FIG. 5(b), except that a frontside connection 547 has been brought up from the plug 546. This makes it easier to connect the actual output voltage to sensor inputs in the control and driver circuitry blocks. The frontside connection 547 can also be used to connect to a high-impedance bias voltage source if desired. Furthermore, tungsten plugs are used in other contacts of the structure. Reference numerals in this Figure which have already been described in an earlier figure correspond to the respective descriptions already given.

Figure 5D:
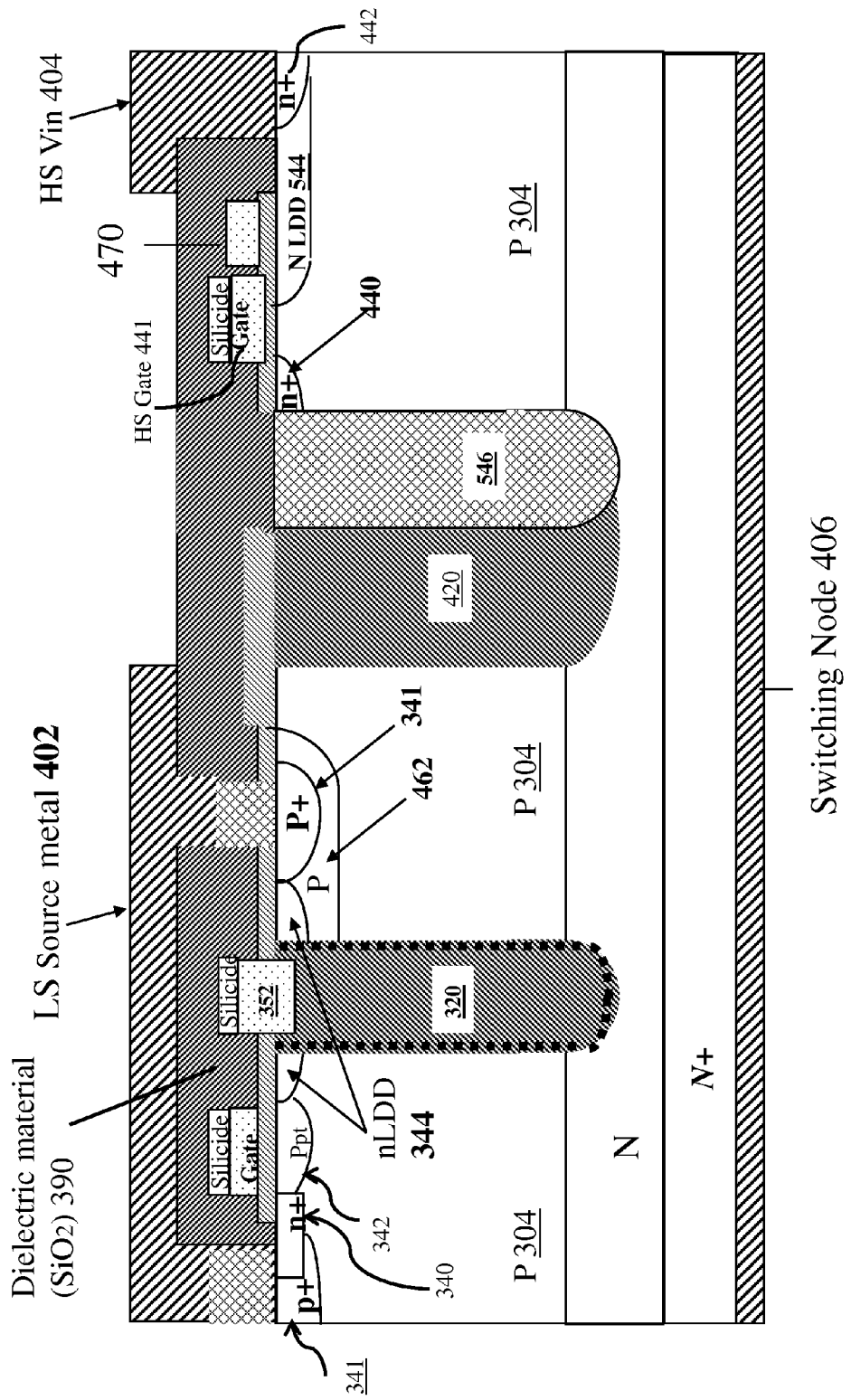

FIG. 5(d) shows another embodiment which is generally somewhat similar to that of FIG. 5(b), except that the insulated trench 420 extends to the plug 546. This reduces the output capacitance Coss and improves the breakdown characteristics of low-side NMOS. Reference numerals in this Figure which have already been described in an earlier figure correspond to the respective descriptions already given.

Figure 6A:
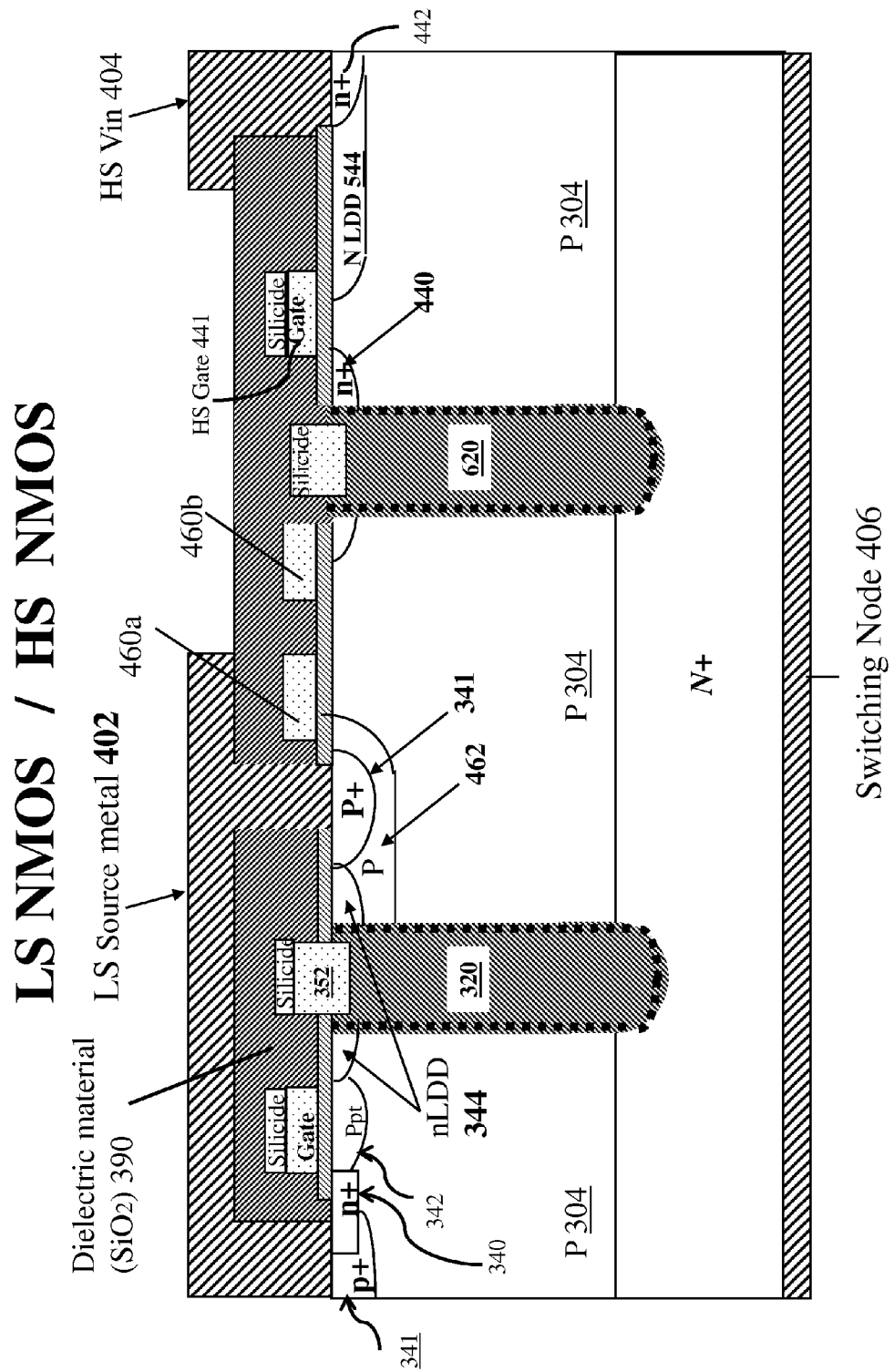

FIG. 6(a) shows another embodiment, which is generally somewhat similar to that shown in FIG. 4(a), except that the N+ sinker has been replaced by another insulated trench 620 which incorporates permanent positive charge. The inversion layer formed due to the permanent positive charge provides a low on-resistance between the high-side n+ source and the N+ substrate (Switching Node). This trench 620 can optionally be identical to the trench 320 used in the LS switch, or can alternatively be given a higher fixed charge density $Q_F$ to reduce the series resistance between the HS source and the back side output node. Reference numerals in this Figure which have already been described in an earlier figure correspond to the respective descriptions already given.

Figure 6B:
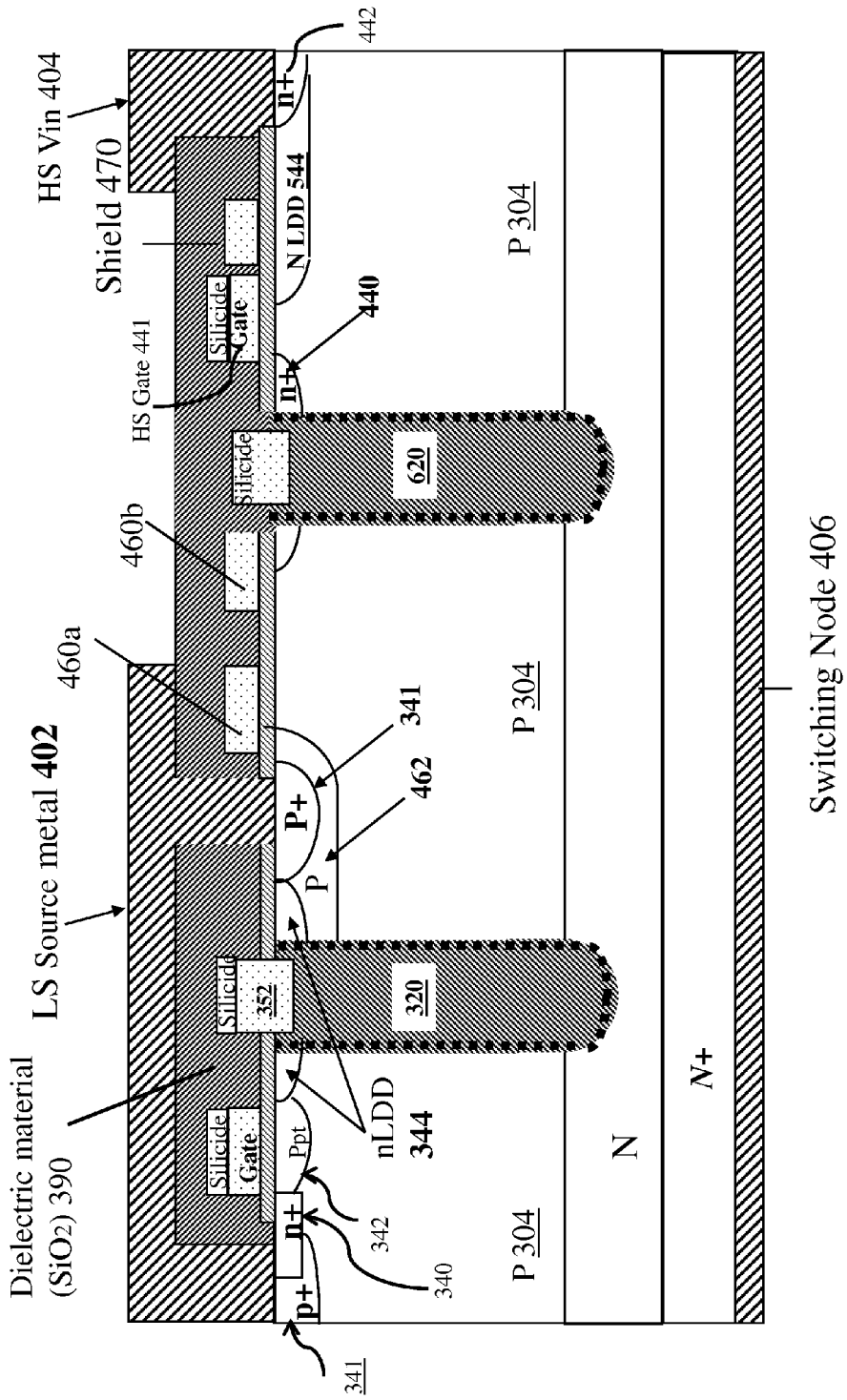

FIG. 6(b) shows another embodiment, which is generally somewhat similar to that shown in FIG. 6(a), except that an additional embedded conductive shield layer 470 is present in the lateral high-side device. Reference numerals in this Figure which have already been described in an earlier figure correspond to the respective descriptions already given.

Figure 6C:
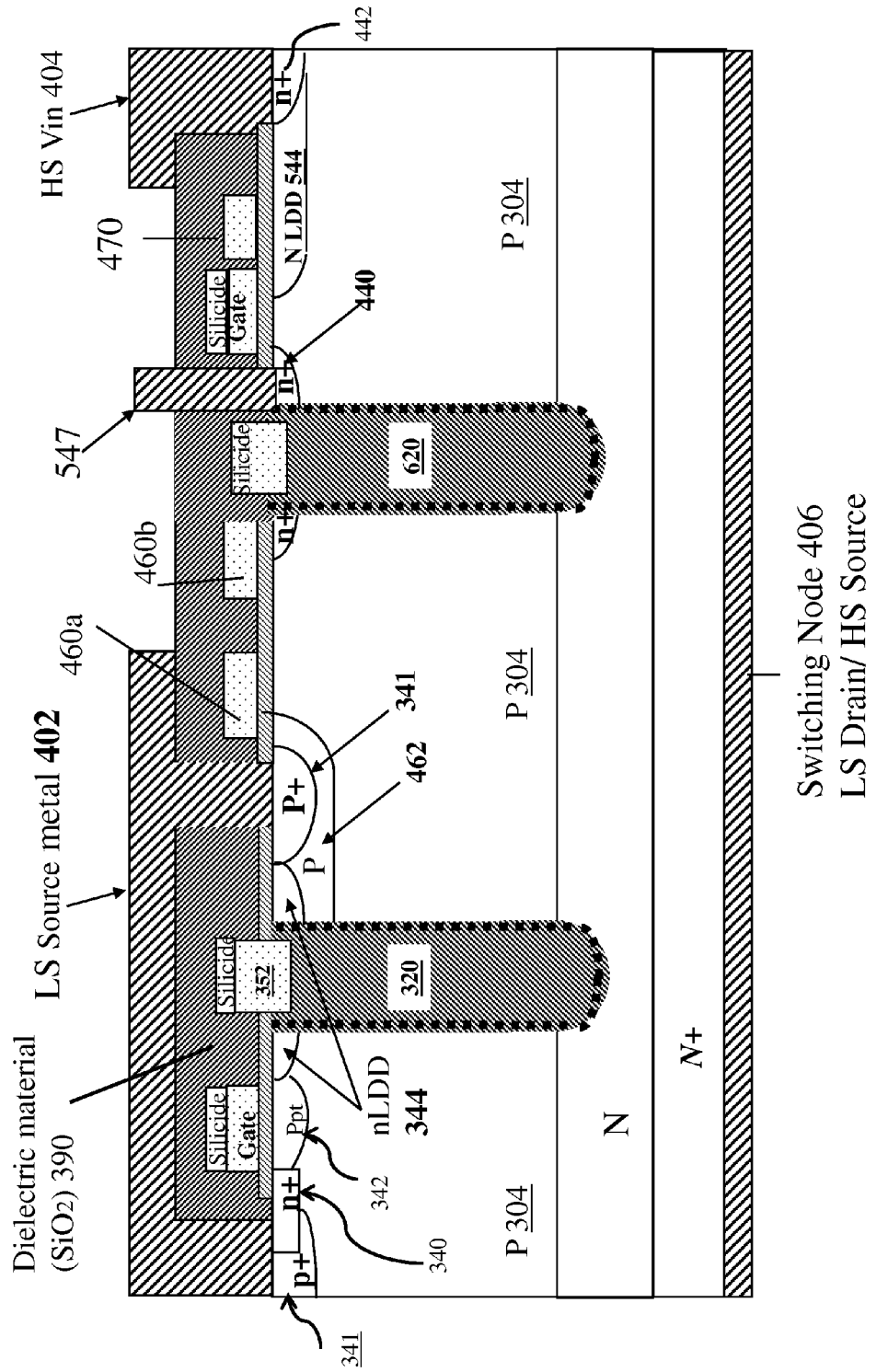

FIG. 6(c) shows another embodiment, which is generally somewhat similar to that of FIG. 6(b), except that a frontside connection 547 has been brought up from the HS source diffusion 440. Reference numerals in this Figure which have already been described in an earlier figure correspond to the respective descriptions already given.

Figure 6D:
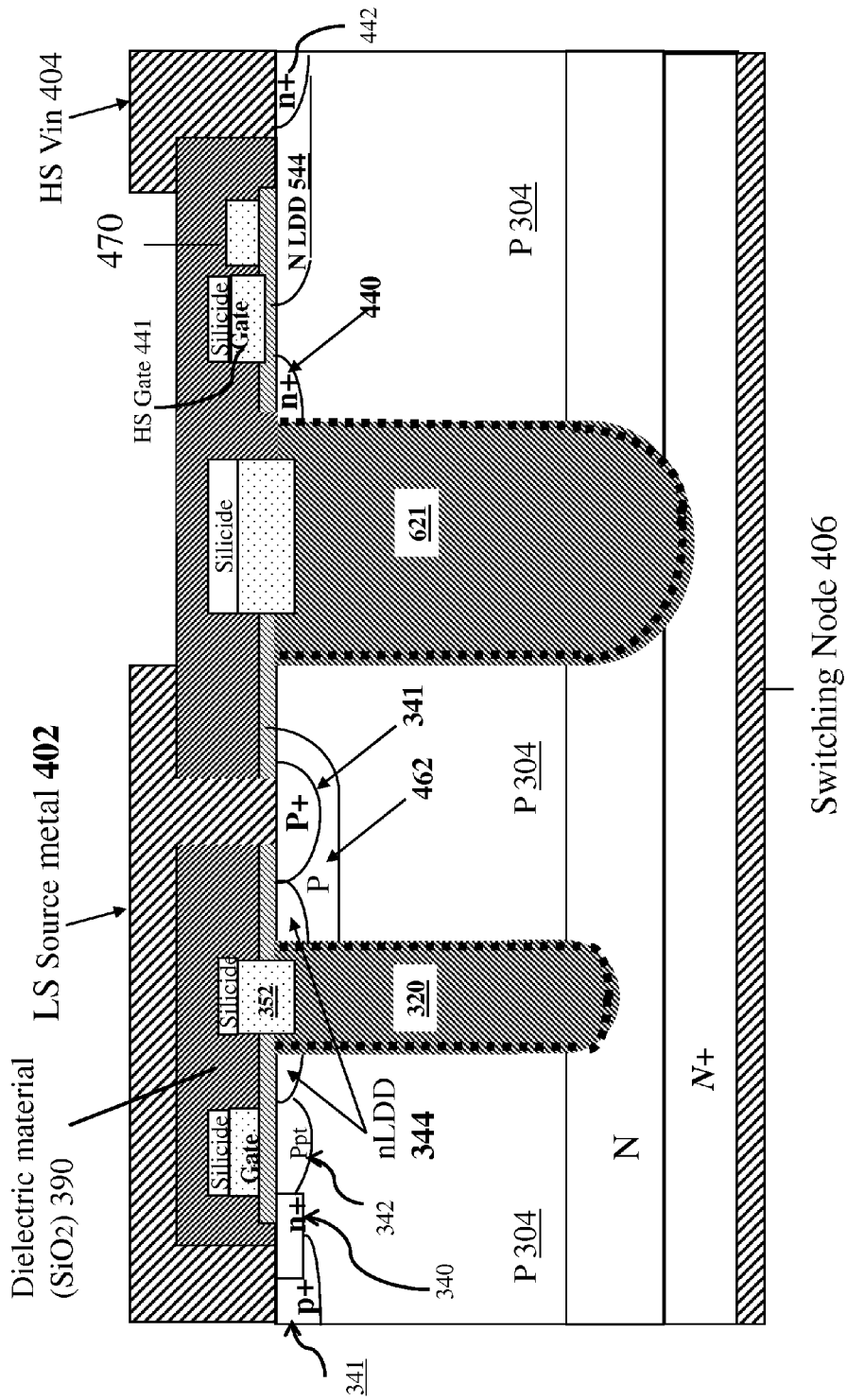

FIG. 6(d) shows another embodiment, which is generally somewhat similar to that of FIG. 6(b), except that the trenches 320 and 620 have been combined into a single trench 621 which extends to the N+ substrate. This improves the breakdown characteristics of low-side NMOS. Both faces of this trench 621 have immobile net electrostatic charge, provided e.g. by a cesium implant into a thin oxide layer before the trench is filled. This wider trench 621 is preferably combined with a wider embedded shield electrode 623, which further reduces the parasitic capacitance Coss. Reference numerals in this Figure which have already been described in an earlier figure correspond to the respective descriptions already given.

FIG. 7(a) shows a top view of a lateral P-channel MOSFET (PMOS) with trenches 710 which are filled with dielectric and incorporate permanent positive charge. The positive charge here will deplete the p-type material which is the drift region of the PMOS transistor, and also provides charge balancing. Hence a higher breakdown voltage and lower specific on-resistance Rsp are achieved. Not all elements are visible in this top view, but the high-side supply metallization (HS Vin) 404, p+ source 740, p+ drain 790, and frontside switching node metallization 547 are visible. Reference numerals in this Figure which have already been described in an earlier figure correspond to the respective descriptions already given.

FIGS. 7(b) and 7(c) show two cross sections of a sample embodiment which combines an integrated vertical low-side N-channel (NMOS) transistor with a lateral high-side P-channel PMOS transistor according to FIG. 7(a). These sectional views not only show the PMOS device of FIG. 7(a), but also show an NMOS structure which, with the structure of FIG. 7(a), provides a complete high-side plus low-side switch.

The use of a PMOS device for the HS switch allows for simpler driver circuits. With a high-side NMOS, the output node cannot be pulled all the way up to the positive supply voltage unless the gate of the HS switch can be driven higher than the positive supply. This requires voltage-boosting circuits. However, a P-channel device avoids this complication.

FIG. 7(b) shows a cross section along section line AA (a line through a mesa region between lateral trenches). When the high-side lateral transistor is ON, holes (which are the positive majority carriers, in a p-channel device) flow from the source 740 through the channel (i.e. the part of n-type body 743 which has been inverted by a sufficiently negative voltage on the second gate terminal 730), and through the P-drift layer 730 to the p+ drain. The hole current is converted to electron current by the p+/n+ connection which is provided by the frontside output terminal 547. (With a PMOS HS switch this connection corresponds to the drain of the lateral transistor, whereas with an NMOS HS switch this connection corresponds to the source of the lateral transistor; but in either case this node corresponds to the output terminal of the half-bridge.) It is important to note that (in this example) connection 547, i.e. the high-side p+/n+ drain short, is connected to the N+ substrate (Switching Node) by a heavily doped N+ sinker diffusion 446. Reference numerals in this Figure which have already been described in an earlier figure correspond to the respective descriptions already given.

FIG. 7(c) shows a cross section along line BB of FIG. 7(a). The mesa region shown in FIG. 7(b) is surrounded by two trenches 710 filled with dielectric material and incorporating permanent positive charge. The positive charge enables the p-type doping of the drift region 720 to be increased beyond what would otherwise be possible, and thus allows a higher breakdown voltage, lower on-resistance, or both. The permanent charge density, the doping concentrations and other parameters such as cell pitch and N+ sinker spacing are designed to achieve the target breakdown voltage. Reference numerals in this Figure which have already been described in an earlier figure correspond to the respective descriptions already given.

Figure 8A:
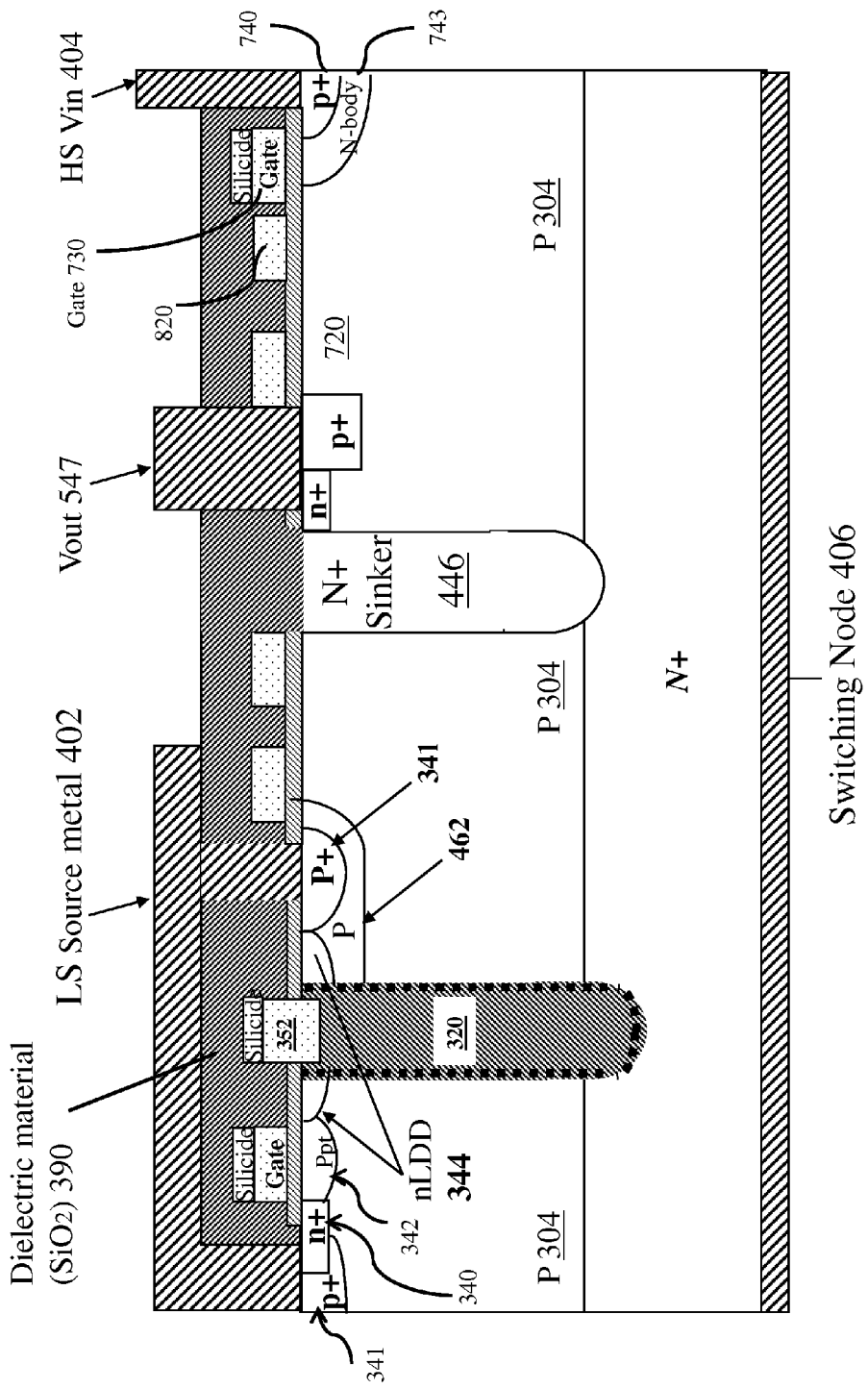
Figure 8B:
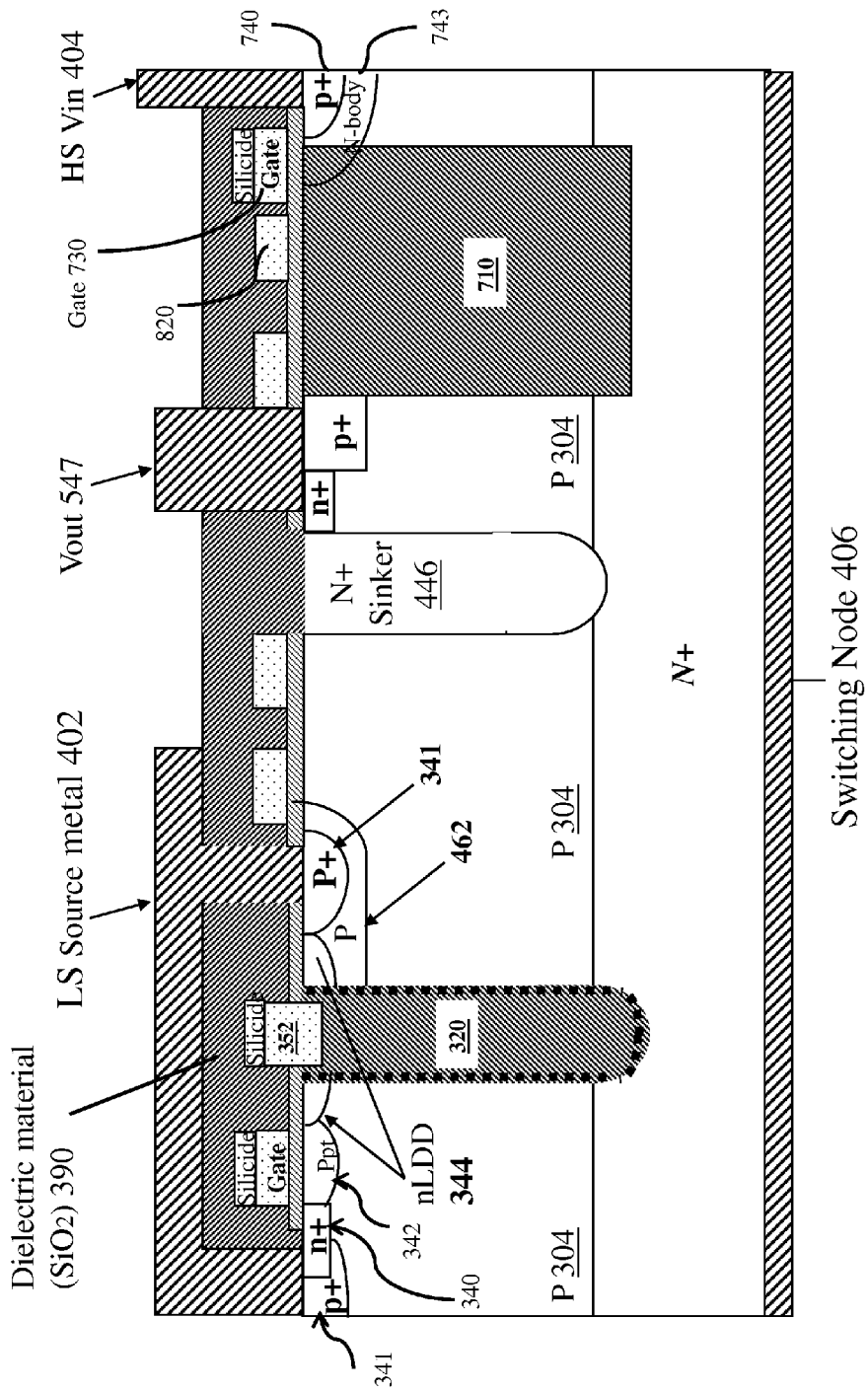

FIGS. 8(a) and 8(b) show another embodiment which is generally somewhat similar to that shown in FIGS. 7(a) and 7(b), except that an additional embedded conductive shield layer 820 is included in the lateral high-side device. The shield layer can be floating or connected to the high-side source potential and provides a reduction in gate-drain capacitance Cgd. Reference numerals in these Figures which have already been described in an earlier figure correspond to the respective descriptions already given.

Figure 8C:
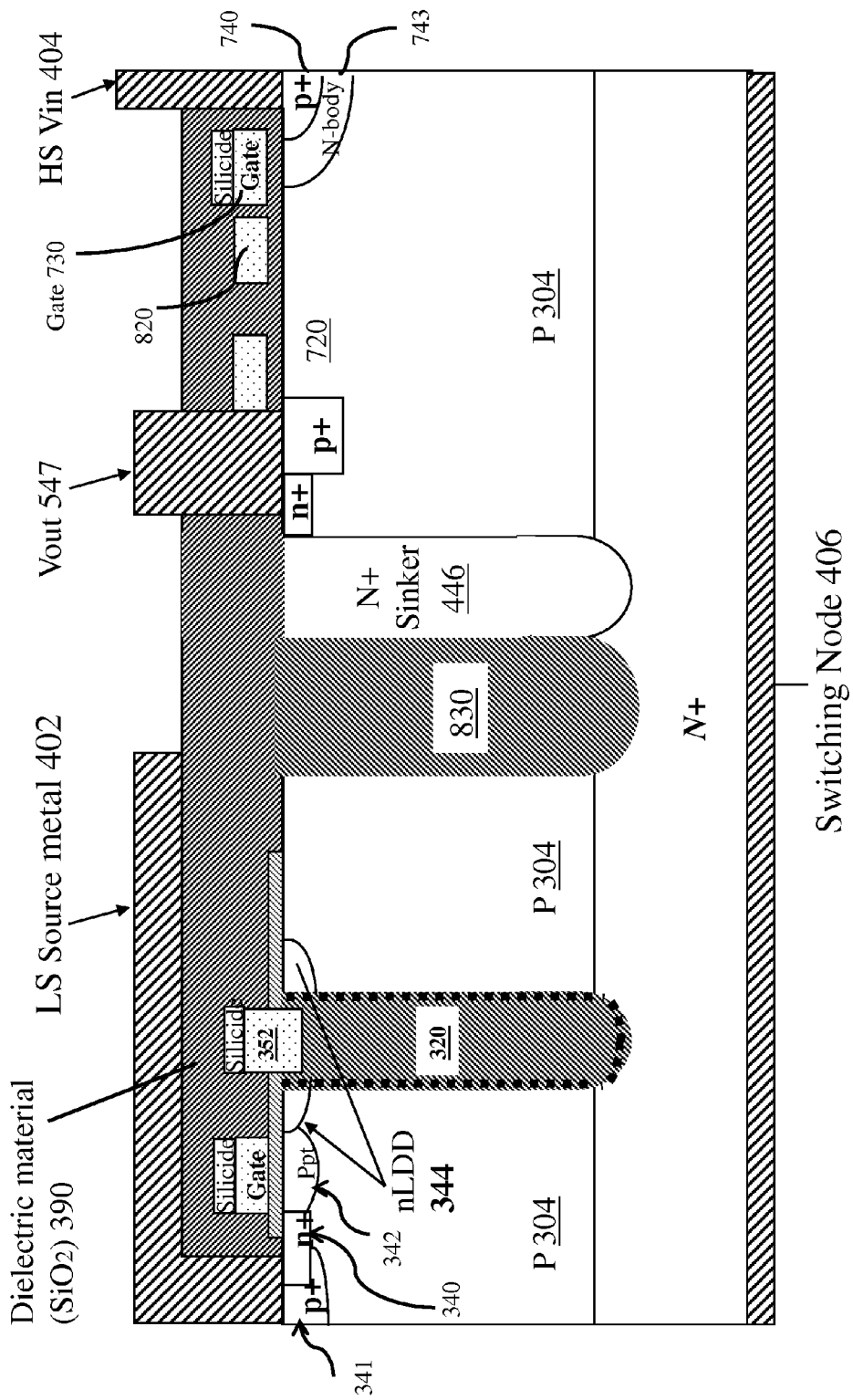

FIG. 8(c) shows another embodiment, which is generally somewhat similar to that shown in FIG. 8(a), except that the isolation trench 830 extends all the way to the N+ sinker 446. This improves the breakdown characteristics of low-side NMOS and simplifies its termination. Reference numerals in this Figure which have already been described in an earlier figure correspond to the respective descriptions already given.

Figure 8D:
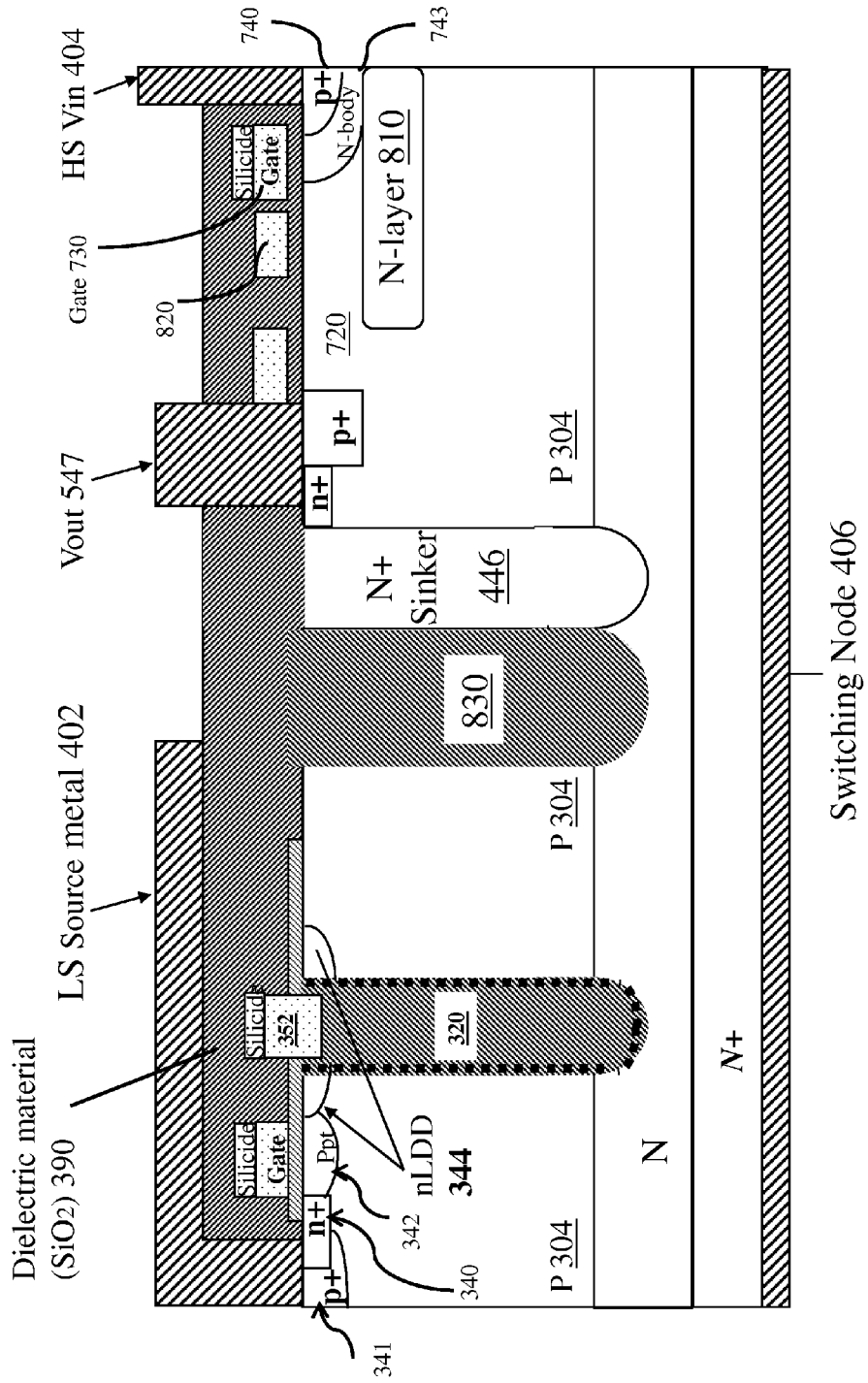

FIG. 8(d) shows another embodiment, which is generally somewhat similar to that shown in FIG. 8(c), except that a buried N-layer 810 has been added in the P bulk layer of the high-side PMOS. This improves the breakdown voltage of the high-side device, and therefore permits the acceptor concentration to be increased, which reduces on-resistance characteristics. Reference numerals in this Figure which have already been described in an earlier figure correspond to the respective descriptions already given.

Figure 9A:
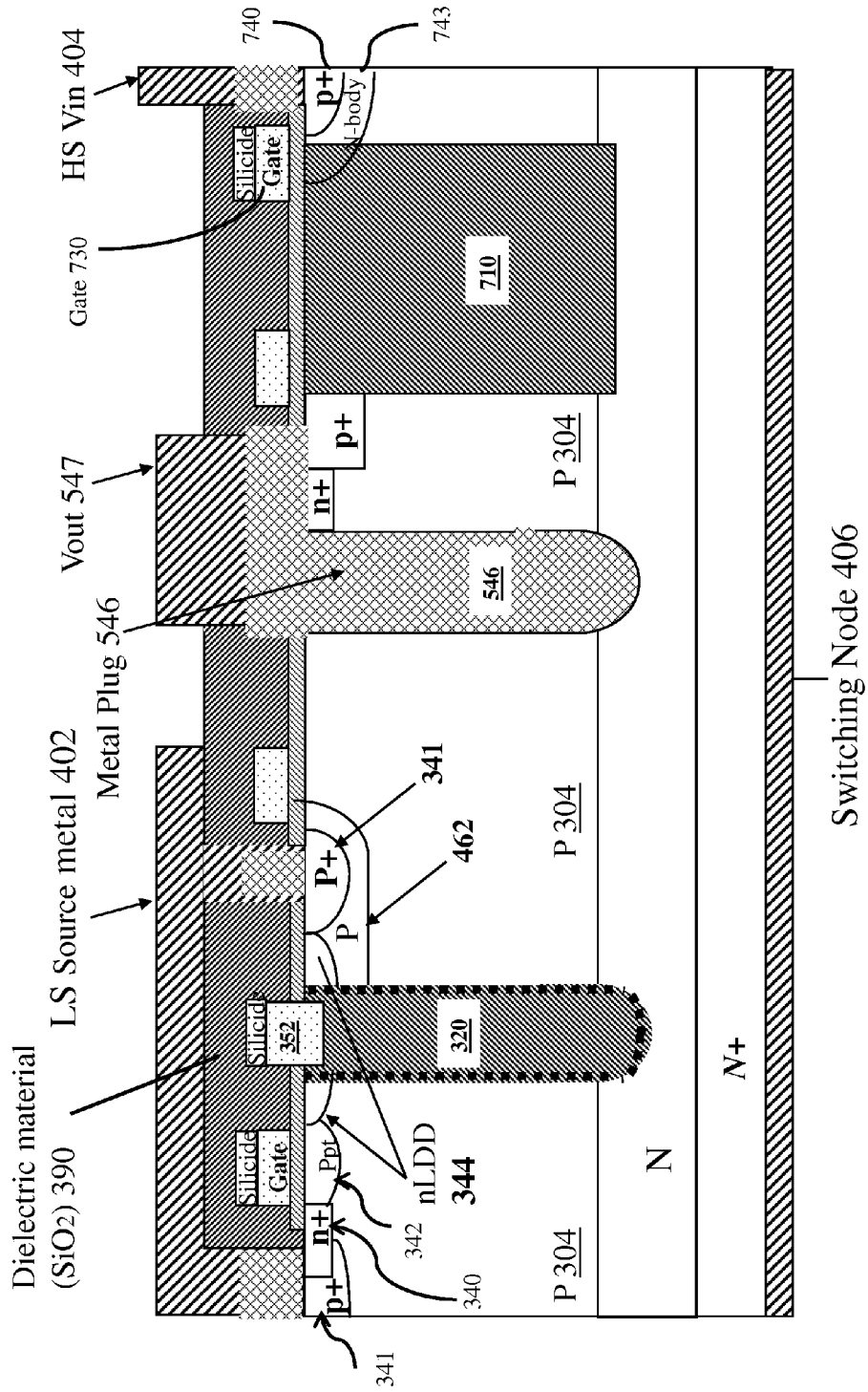

FIG. 9(a) shows another embodiment, which is generally somewhat similar to that shown in FIG. 7(b), except that the N+ sinker 446 has been replaced by a tungsten plug 546 to provide a low on-resistance between the high-side p+/n+ drain short 547 and the N+ substrate (Switching Node 406). Reference numerals in this Figure which have already been described in an earlier figure correspond to the respective descriptions already given.

Figure 9B:
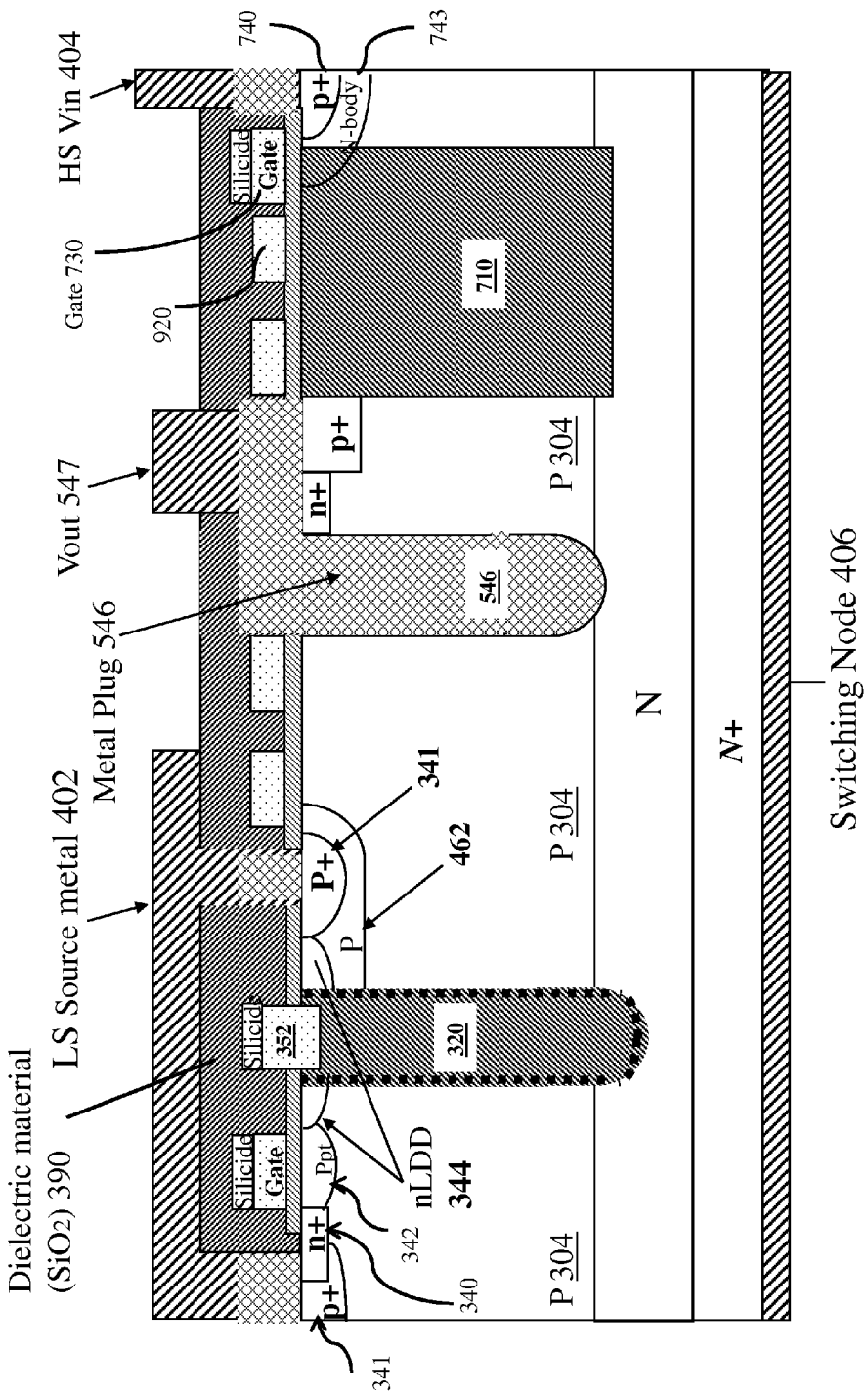

FIG. 9(b) shows another embodiment, which is generally somewhat similar to that shown in FIG. 9(a), except that an additional embedded conductive shield layer 920 in the lateral high-side device. Reference numerals in this Figure which have already been described in an earlier figure correspond to the respective descriptions already given.

Figure 9C:
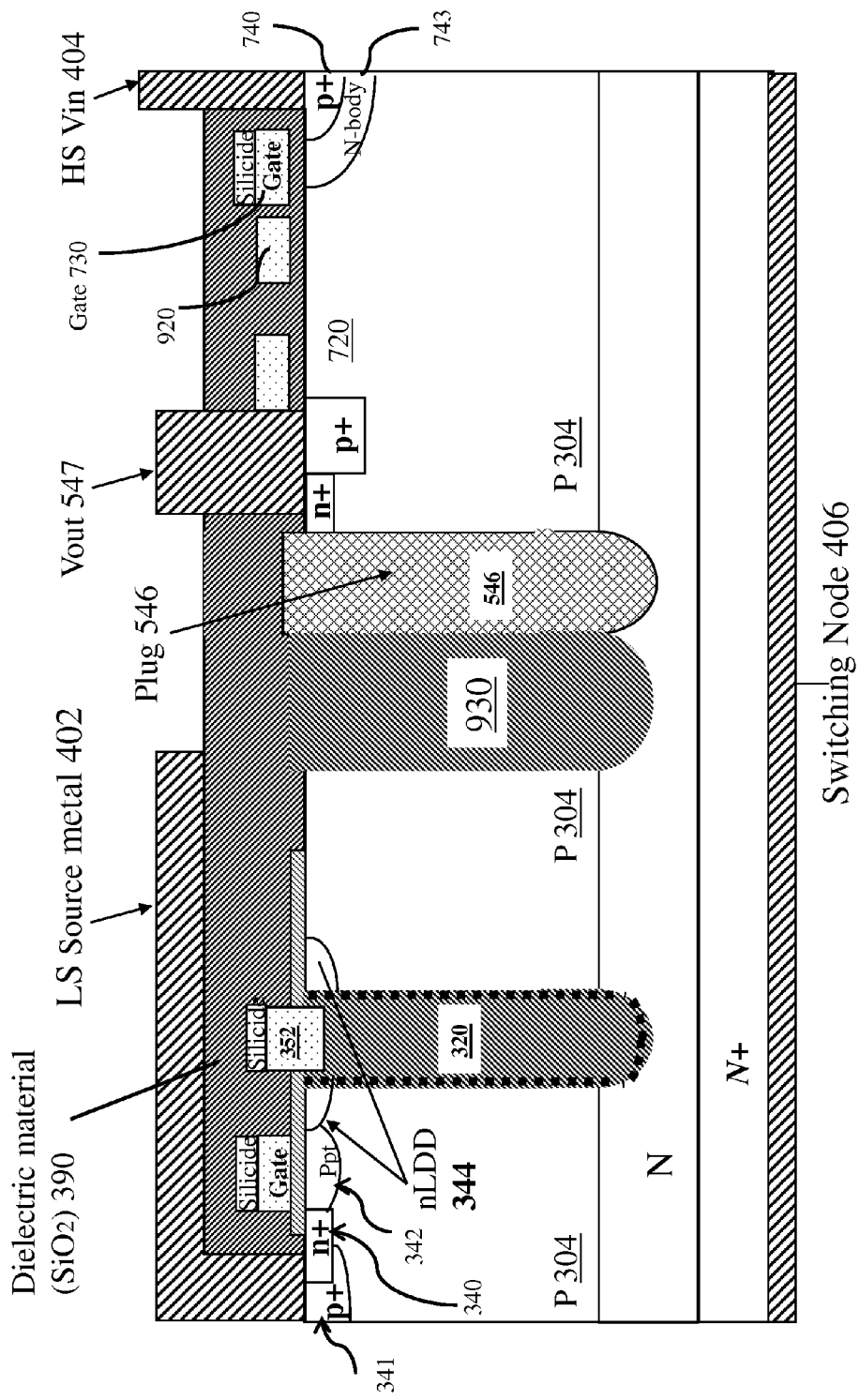

FIG. 9(c) shows another embodiment, which is generally somewhat similar to that shown in FIG. 9(a), except that an additional oxide filled isolation trench layer extends to the tungsten plug to improve breakdown characteristics of low-side NMOS. Reference numerals in this Figure which have already been described in an earlier figure correspond to the respective descriptions already given.

Figure 9D:
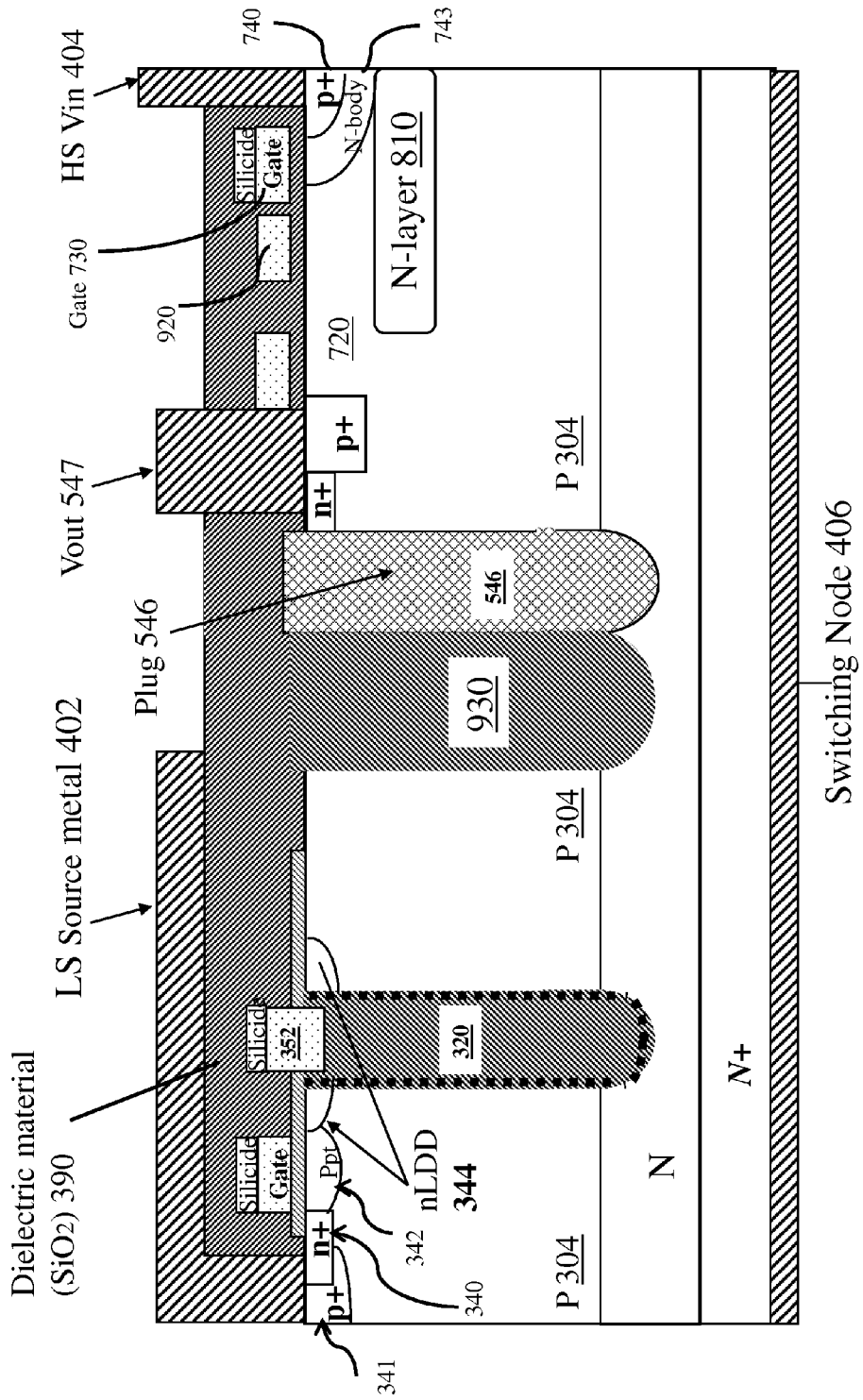

FIG. 9(d) shows another embodiment, which is generally somewhat similar to that shown in FIG. 9(c), except that a buried N-layer 810 has been added in the P bulk layer of the high-side PMOS. This improves the breakdown voltage of the high-side device, and therefore permits the acceptor concentration to be increased, which reduces on-resistance characteristics. Reference numerals in this Figure which have already been described in an earlier figure correspond to the respective descriptions already given.

Figure 10A:
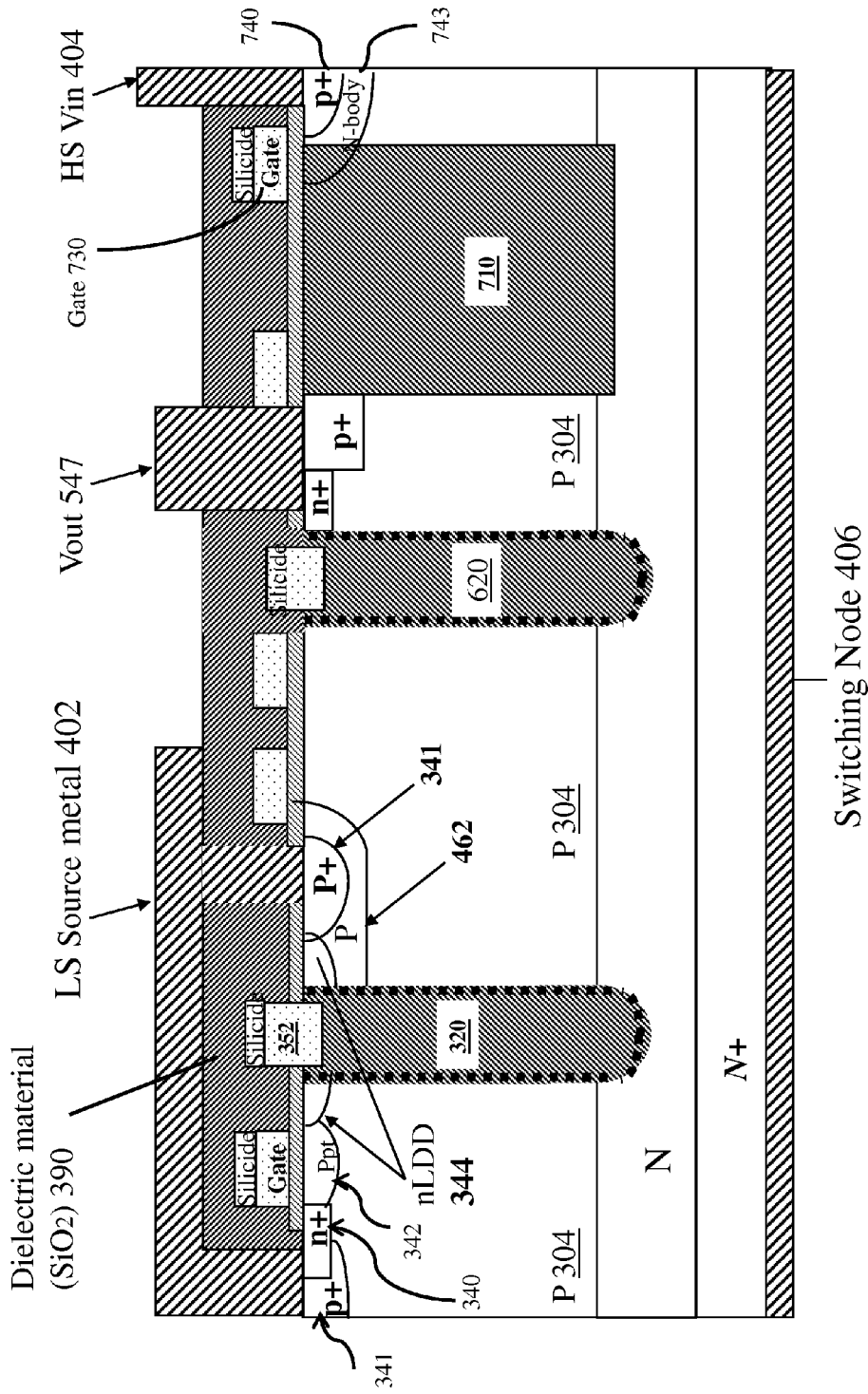

FIG. 10(a) shows another embodiment, which is generally somewhat similar to that shown in FIG. 7(b), except that the N+ sinker is replaced by a trench 620 filled with dielectric material that incorporates permanent positive charge. The inversion layer formed due to the permanent positive charge provides a low on-resistance between the high-side p+/n+ drain short and the N+ substrate (Switching Node 406). Reference numerals in this Figure which have already been described in an earlier figure correspond to the respective descriptions already given. Reference numerals in this Figure which have already been described in an earlier figure correspond to the respective descriptions already given.

Figure 10B:
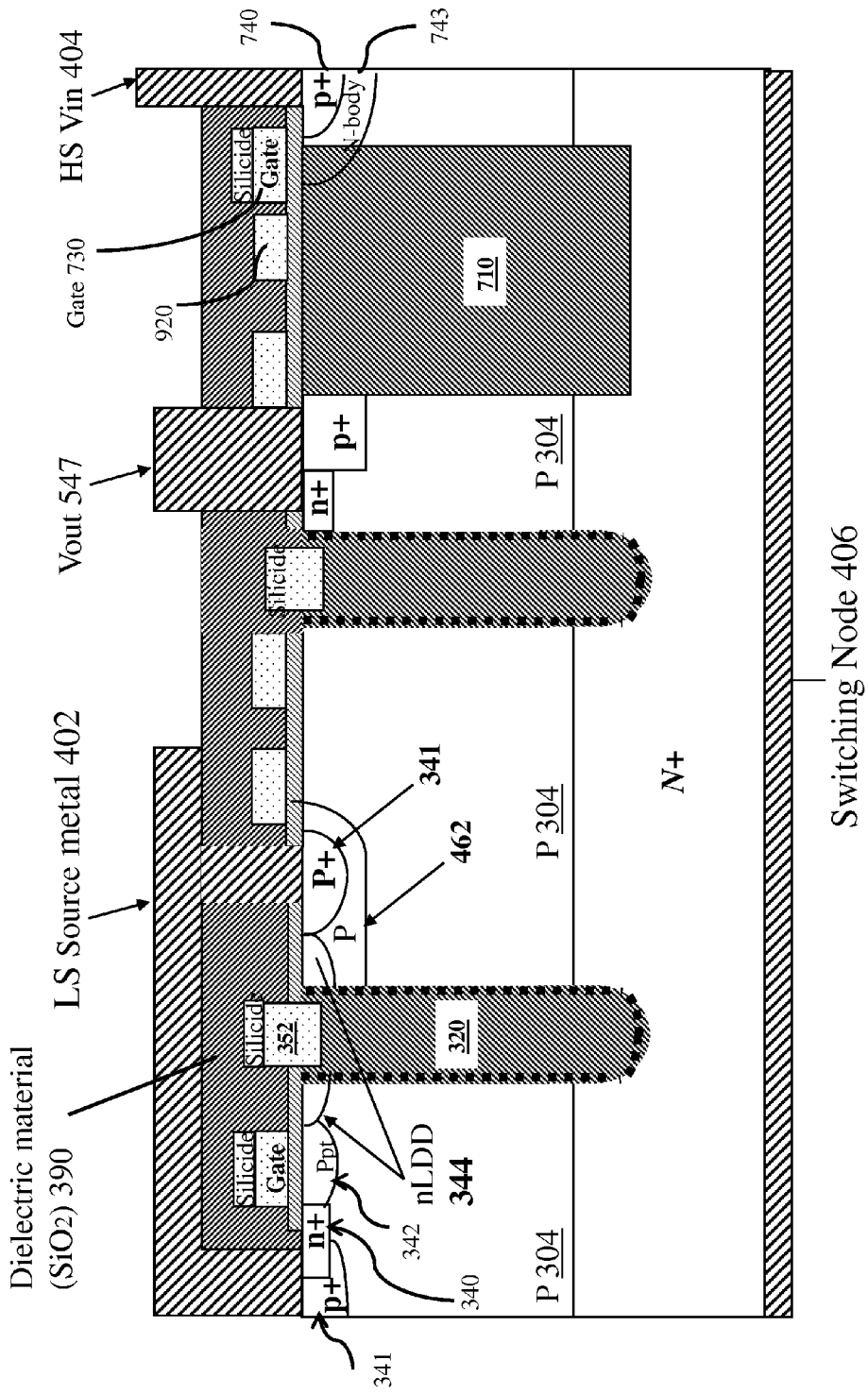

FIG. 10(b) shows another embodiment, which is generally somewhat similar to that shown in FIG. 10(a), but with an additional embedded conductive shield layer 623 in the lateral high-side device. Reference numerals in this Figure which have already been described in an earlier figure correspond to the respective descriptions already given.

Figure 10C:
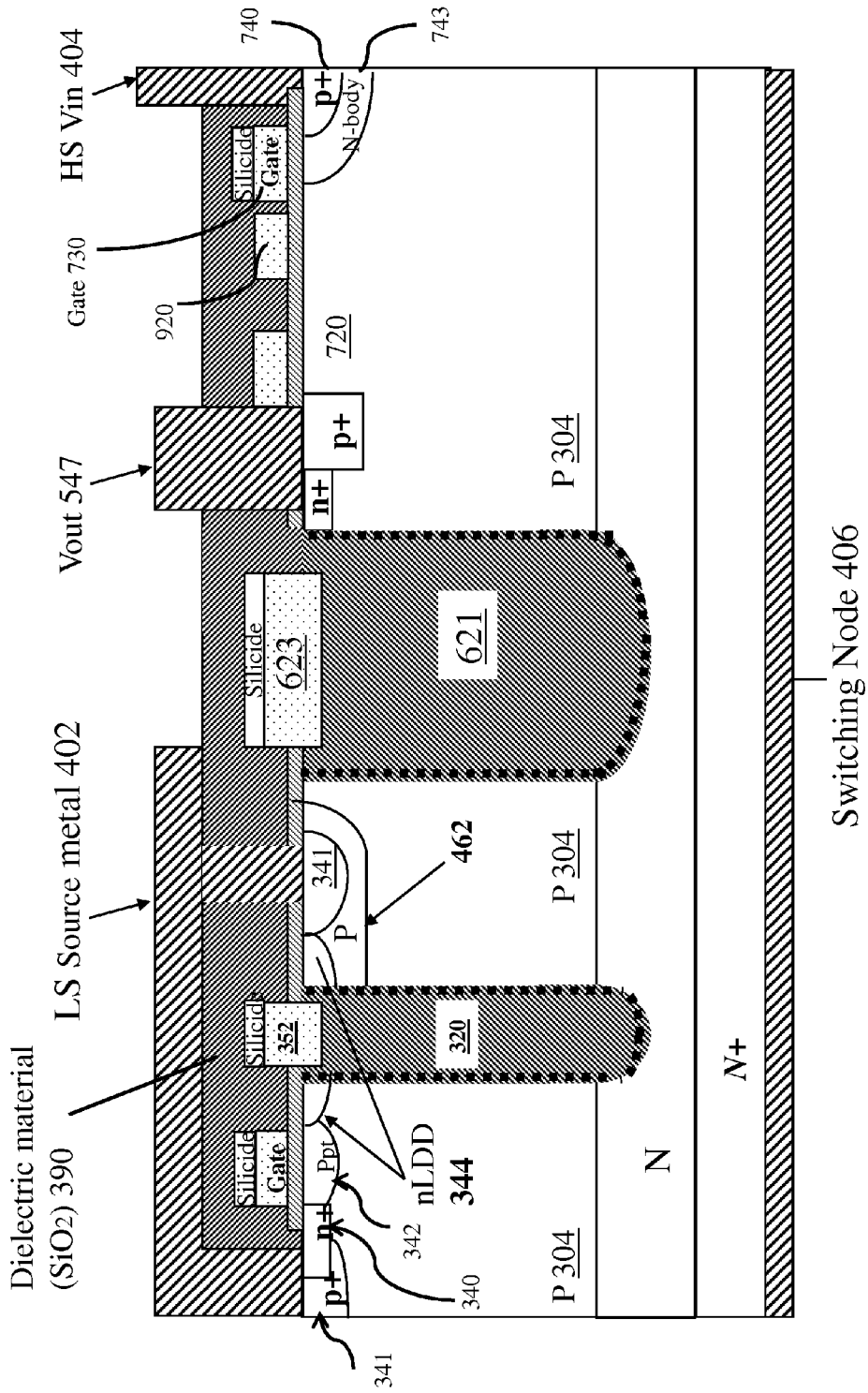

FIG. 10(c) shows another embodiment, which is generally somewhat similar to that shown in FIG. 10(a), except that the oxide filled trench layer 620 has been replaced by a wider trench 621 with a wider embedded shield electrode 623. This reduces the output capacitance Coss, and also improves breakdown characteristics of low-side NMOS. Reference numerals in this Figure which have already been described in an earlier figure correspond to the respective descriptions already given.

Figure 10D:
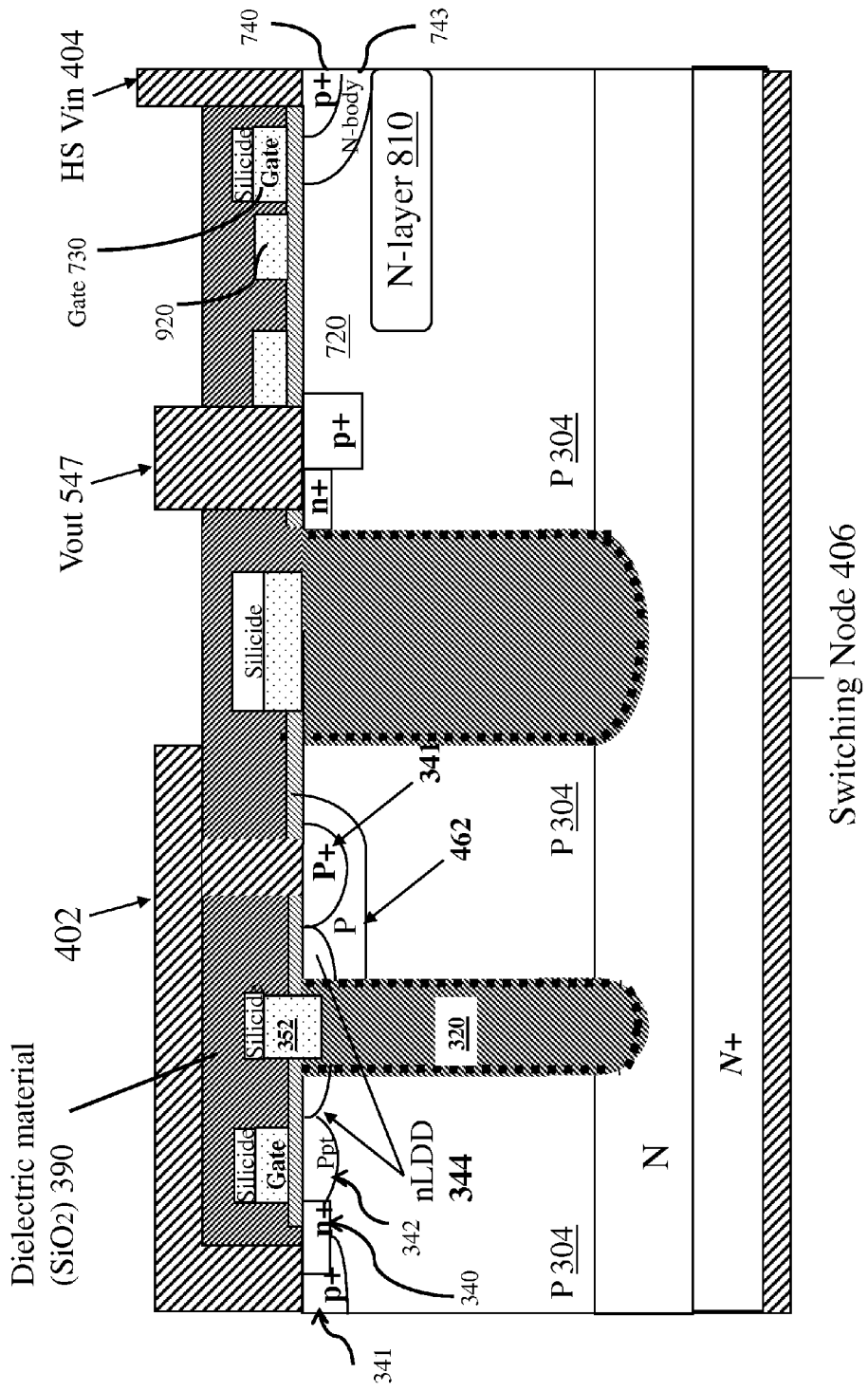

FIG. 10(d) shows another embodiment, which is generally somewhat similar to that shown in FIG. 10(c), except that a buried N-layer 810 has been added in the P bulk layer of the high-side PMOS. This improves the breakdown voltage of the high-side device, and therefore permits the acceptor concentration to be increased, which reduces on-resistance characteristics. Reference numerals in this Figure which have already been described in an earlier figure correspond to the respective descriptions already given.

FIG. 11 shows a generic schematic of a monolithically integrated dc-dc converter, using device structures as described above. Area 1120 is the low-side switch, which can be, for example, an array of the structures shown in FIG. 3(a) or FIG. 3(b). Area 1110 is the high-switch switch, which can be, for example, an array of pull-up devices as shown in any of FIGS. 4a-10d. Area 1130 provides gate drive to these switching devices. (An NMOS high-side switch, for example, may need its gate to be driven above the high-side supply voltage.)

Area 1140 contains the more complex circuitry which provides (in this example) control of the pulse-width-modulation (PWM) functions which make the devices operate with correct timing to make the circuit operate as intended. It is important to note that area 1140 is preferably a low-voltage domain, which is not exposed to the large magnitudes of supply voltage differences present in the areas 1110-1130. (Depending on the application, the power devices in this integrated structure would typically see a supply range of tens or perhaps a few hundreds of Volts, but the low-voltage domains would operate with a supply voltage of 5V or less.) The boundary between voltage domains is illustrated with a dashed line in FIG. 11.

The circuits in the low-voltage domain can be realized using CMOS, Bipolar, JFET, Diodes, or other additional device components.

Isolation of the low voltage domain from the high-side and low-side switches can be achieved using conventional techniques such as forming junction isolation rings or trenches and buried layers. This isolation will also help to protect the low-voltage circuitry from the strong transient voltages which may be generated by normal operation of the large switches.

Figure 12:
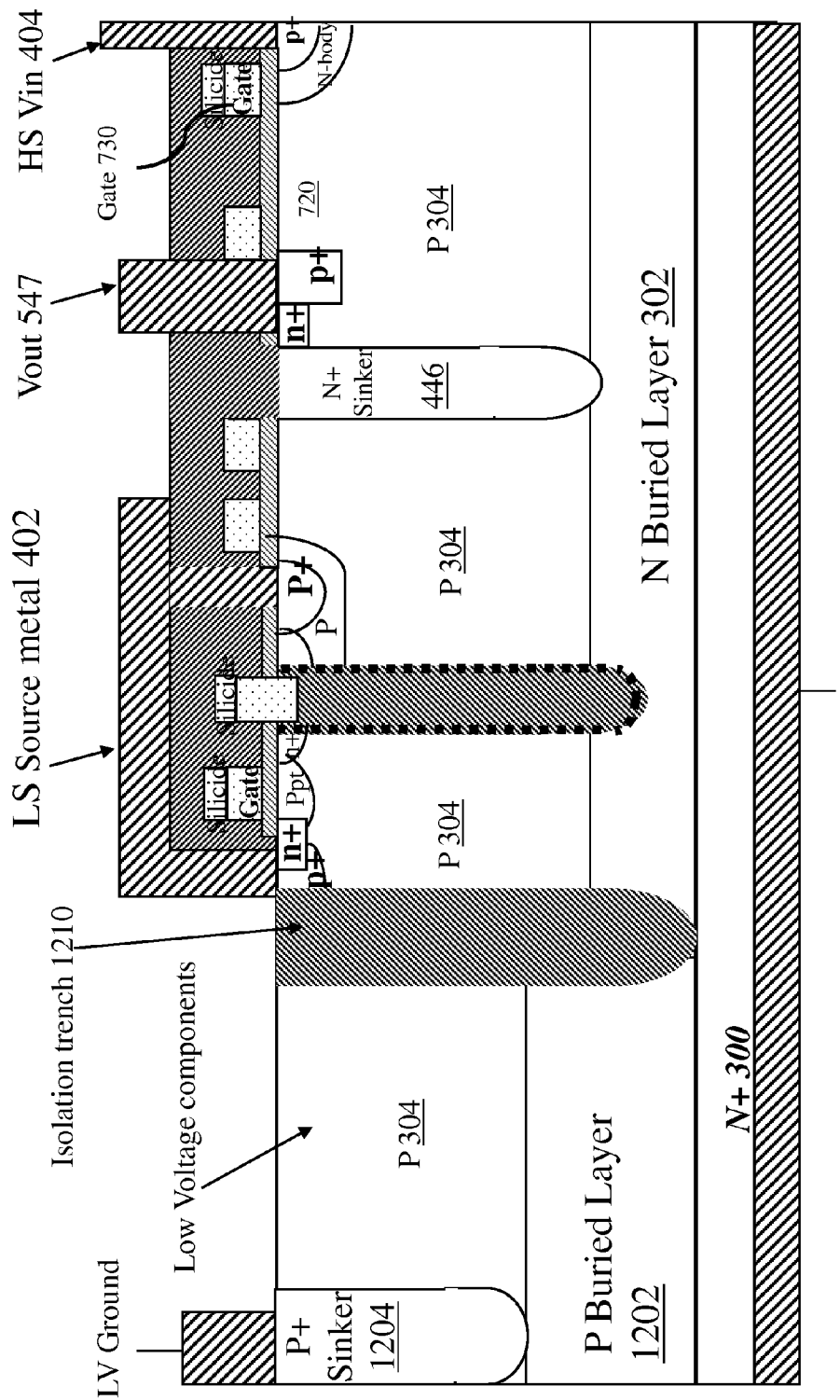
FIG. 12 shows a sample implementation of isolation between high-voltage and low-voltage domains.

FIG. 12 shows a sample implementation of a smart power integrated circuit using devices as described above. This Figure particularly illustrates isolation between the high-voltage and low-voltage domains. Note that the low-voltage domain (shown on the left) uses a p-type buried layer 1202, connected through a sinker diffusion 1204 (or alternatively by a tungsten plug), to provide its ground. (The output node will not go below ground unless driven there by an inductive load, so the junction between the p-type buried layer 1202 and substrate 300 will not normally be forward biased.)

The N+ sinker diffusion (or the metal plug) is preferably extended to form guard rings around both the HS driver and the LS driver. In addition, as shown in FIG. 12, a dielectric-filled trench 1210 can also be used at the boundary between HV and LV domains. Many other elements in this Figure correspond to device elements already described.

Another consideration in optimization of the device designs is behavior under forward bias. In some motor control and power supply applications, forward bias can be expected to occur. In such cases it may be desirable to add a shunt diode, or to use a device layout where the area of the body junction is relatively high.

The combined device structures described above are expected to be useful in many applications, and not only in power converters. For example, contemplated applications include phase converters, variable-speed motor drives, audio amplifiers, and display drivers.

According to some disclosed embodiments (but not necessarily all), there is provided: A semiconductor device, comprising: an n-channel transistor having a source which is connected to a first supply voltage terminal, and a current control portion which is configured to, when on, inject electrons into an induced drain extension which is created within p-type semiconductor material by an insulated trench which contains sufficient immobile net positive electrostatic charge to invert portions of said semiconductor material, so that electrons flow substantially vertically downward to a drain which is connected to a deep conductive layer; a lateral transistor, having a first source/drain diffusion which is connected to a second supply voltage terminal, and having a respective current control portion which controls current between said first source/drain diffusion and a second source/drain diffusion; a vertical conductor which electrically connects said second source/drain diffusion to said deep conductive layer; and an output terminal which is operatively connected to said deep conductive layer and said vertical conductor.

According to some disclosed embodiments (but not necessarily all), there is provided: A semiconductor device, comprising: a semiconductor structure including at least one p-type crystalline layer over at least one n-type crystalline layer; one or more first n-channel field-effect transistors, wherein at least some ones of said transistors include: a p-type body region which is continuous with said p-type crystalline layer; a gate electrode which is capacitively coupled to controllably invert at least some portions of said body region, to thereby form a channel; one or more insulated trenches, extending downward into said p-type crystalline layer, and having immobile positive ions therein which provide a net positive electrostatic charge; one or more second n-channel field-effect transistors, which have lateral conduction within said p-type crystalline layer; and an electrical connection, between drains of said first transistors and sources of said second transistors, which provides an output terminal for said device.

According to some disclosed embodiments (but not necessarily all), there is provided: A semiconductor device, comprising: a first transistor having a first conductivity type source region, which is connected to a first supply voltage terminal, and which overlies a body region of a second conductivity type; a gate electrode which is connected to selectably invert a portion of said body region, to thereby create a channel within said body region through which majority carriers can flow from said source region; and a drift region of said second conductivity type, including induced drain extension portions, adjacent to a trench dielectric which contains immobile net electrostatic charge, where said electrostatic charge inverts a portion of said drift region to permit passage of said majority carriers downward to an output terminal; a second transistor, having a first source/drain diffusion which is connected to a second supply voltage terminal, and having a gate electrode which controls current between said first source/drain diffusion and a second source/drain diffusion; and a vertical conductor which electrically connects said second source/drain diffusion to said output terminal.

According to some disclosed embodiments (but not necessarily all), there is provided: A semiconductor device, comprising: a semiconductor structure including at least one p-type crystalline layer over at least one n-type crystalline layer; one or more first n-channel field-effect transistors, wherein at least some ones of said transistors include: a p-type body region which is continuous with said p-type crystalline layer; a gate electrode which is capacitively coupled to controllably invert at least some portions of said body region, to thereby form a channel; one or more insulated trenches, extending downward into said p-type crystalline layer, and having immobile positive ions therein which provide a net positive electrostatic charge and thereby invert a portion of said p-type layer; one or more second n-channel field-effect transistors, which provide controllable lateral conduction within said p-type crystalline layer; and an output terminal which is electrically connected to said drains of said first transistors and said sources of said second transistors.

According to various disclosed embodiments (but not necessarily all), there is provided a power integrated circuit, which includes one or more semiconductor devices as described in any of the preceding paragraphs, in combination with control and drive circuitry which operates those semiconductor devices to achieve a desired circuit function.

According to various disclosed embodiments (but not necessarily all), there is provided: A method of operating a half-bridge switch, in a power integrated circuit, comprising the actions of: at first times, turning on an n-channel power transistor having vertical flow of majority carriers both through a channel region which is selectably inverted by a gate electrode, and through an induced drain extension region below said channel region which is statically inverted by a net electrostatic charge which is immobile, to thereby pull an output terminal toward a first and lower supply voltage; and at second times, turning on a lateral power transistor to drive said output terminal toward a second supply voltage which is more positive than said first supply voltage; wherein a metallic conductor provides an electrical connection between a drain of said first transistor and a current-carrying terminal of said lateral power transistor.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

The disclosed inventions are also applicable to corresponding structures that use negative permanent charge and replace the P region between the p-body and drain regions with an N-region. Permanent negative charge can be created for example by using different dielectric layers such as silicon dioxide and Aluminum Oxide.

The doping levels needed to achieve high breakdown and low-resistance are governed by the well known charge balance condition. The specific electrical characteristics of devices fabricated using the methods described in this disclosure depend on a number of factors including the thickness of the layers, their doping levels, the materials being used, the geometry of the layout, etc. One of ordinary skill in the art will realize that simulation, experimentation, or a combination thereof can be used to determine the design parameters needed to operate as intended.

While the figures shown in this disclosure are qualitatively correct, the geometries used in practice may differ and should not be considered a limitation in anyway. It is understood by those of ordinary skill in the art that the actual cell layout will vary depending on the specifics of the implementation and any depictions illustrated herein should not be considered a limitation in any way.

It should be noted in the above drawings the positive and permanent charge was drawn for illustration purpose only. It is understood that the charge can be in the dielectric (oxide), at the interface between the silicon and oxide, inside the silicon layer or a combination of all these cases.

It is also contemplated that the above teachings can be adapted to provide multiple half-bridges (or phase legs) on a single chip. This complicates the device and process design somewhat, e.g. multiple separate n-type buried layers may be necessary.

It is also understood that numerous combinations of the above embodiments can be realized.

It is understood by those of ordinary skill in the art that other variations to the above embodiments can be realized using other known termination techniques.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A semiconductor device, comprising:
    an n-channel transistor having a source which is connected to a first supply voltage terminal, and a first current control portion which is configured to, when on, inject electrons into an induced drain extension which is created within p-type semiconductor material by an insulated trench which contains sufficient immobile net positive electrostatic charge to invert portions of said semiconductor material, so that electrons flow substantially vertically downward to a drain which is connected to a deep conductive layer;
    a lateral transistor, having a first source/drain diffusion which is connected to a second supply voltage terminal, and having a second current control portion which controls current between said first source/drain diffusion and a second source/drain diffusion;
    a vertical conductor which electrically connects said second source/drain diffusion to said deep conductive layer; and
    an output terminal which is operatively connected to said deep conductive layer and said vertical conductor.

2. The device of claim 1, wherein said lateral transistor is a p-channel device, and said first source/drain diffusion is a p+ source diffusion.

3. The device of claim 1, wherein said lateral transistor is an n-channel device, and said first source/drain diffusion is an n+ drain diffusion.

4. The device of claim 1, wherein said deep conductive layer comprises an n+ semiconductor substrate.

5. The device of claim 1, wherein said deep conductive layer comprises an n-type buried layer.

6. The device of claim 1, wherein said output terminal is a backside connection to a semiconductor device.

7. The device of claim 1, wherein said first and second current control portions are insulated gate transistor structures.

8. A semiconductor device, comprising:
- a semiconductor structure including at least one p-type crystalline layer over at least one n-type crystalline layer;
- one or more first n-channel field-effect transistors, wherein at least some ones of said transistors include:
  - a p-type body region which is continuous with said p-type crystalline layer;
  - a gate electrode which is capacitively coupled to controllably invert at least some portions of said body region, to thereby form a channel;
- one or more insulated trenches, extending downward into said p-type crystalline layer, and having immobile positive ions therein which provide a net positive electrostatic charge;
- one or more second n-channel field-effect transistors, which have lateral conduction within said p-type crystalline layer; and
- an electrical connection, between drains of said first transistors and sources of said second transistors, which provides an output terminal for said device.

9. The device of claim 8, wherein said electrical connection is provided by a heavily-doped diffusion.

10. The device of claim 8, wherein said electrical connection is provided by a metal plug.

11. The device of claim 8, wherein said electrical connection is provided by a tungsten plug.

12. The device of claim 8, wherein said electrical connection is provided by another insulated trench, which also extends downward into said p-type crystalline layer, and which also has immobile positive ions therein which provide a net positive electrostatic charge.

13. The device of claim 8, wherein said output terminal is a backside connection to a semiconductor device.

14. A semiconductor device, comprising:
- a first transistor having
  - a first conductivity type source region, which is connected to a first supply voltage terminal, and which overlies a body region of a second conductivity type;
  - a gate electrode which is connected to selectably invert a portion of said body region, to thereby create a channel within said body region through which majority carriers can flow from said source region; and
  - a drift region of said second conductivity type, including induced drain extension portions, adjacent to a trench dielectric which contains immobile net electrostatic charge, where said electrostatic charge inverts a portion of said drift region to permit passage of said majority carriers downward to an output terminal;
- a second transistor, having a first source/drain diffusion which is connected to a second supply voltage terminal, and having a gate electrode which controls current between said first source/drain diffusion and a second source/drain diffusion; and
- a vertical conductor which electrically connects said second source/drain diffusion to said output terminal.

15. The device of claim 14, wherein said lateral transistor is a p-channel device, and said first source/drain diffusion is a p+ source diffusion.

16. The device of claim 14, wherein said lateral transistor is an n-channel device, and said first source/drain diffusion is an n+ drain diffusion.

17. The device of claim 14, wherein said output terminal is a backside connection to a semiconductor device.

* * * * *